US009972933B2

(12) United States Patent
Kimura et al.

(10) Patent No.: US 9,972,933 B2
(45) Date of Patent: *May 15, 2018

(54) CONTACT PROBE

(71) Applicant: Japan Electronic Materials Corporation, Hyogo (JP)

(72) Inventors: Teppei Kimura, Hyogo (JP); Noriyuki Fukushima, Hyogo (JP); Atsuo Urata, Hyogo (JP); Naoki Arita, Hyogo (JP); Tomoyuki Takeda, Hyogo (JP)

(73) Assignee: Japan Electronic Materials Corporation, Hyogo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/674,541

(22) Filed: Aug. 11, 2017

(65) Prior Publication Data
US 2017/0346211 A1    Nov. 30, 2017

Related U.S. Application Data

(63) Continuation of application No. 14/430,557, filed as application No. PCT/JP2013/081957 on Nov. 27, 2013.

(30) Foreign Application Priority Data

Dec. 4, 2012  (JP) ................. 2012-265364
Jan. 9, 2013  (JP) ................. 2013-001903

(51) Int. Cl.
H01R 13/24    (2006.01)
G01R 1/073    (2006.01)
G01R 1/067    (2006.01)

(52) U.S. Cl.
CPC ..... H01R 13/2428 (2013.01); G01R 1/06716 (2013.01); G01R 1/07357 (2013.01); *G01R 1/06738* (2013.01)

(58) Field of Classification Search
CPC ..................... H01R 11/18; H01R 13/2428
(Continued)

(56) References Cited

U.S. PATENT DOCUMENTS 4,773,877 A * 9/1988 Kruger ............... G01R 1/06722
                                                324/755.05
5,765,075 A   6/1998 Yamamoto
(Continued)

FOREIGN PATENT DOCUMENTS

JP    2007-132681 A    5/2007
JP    2007-178403 A    7/2007
(Continued)

OTHER PUBLICATIONS

International Search Report issued in corresponding International Patent Application No. PCT/JP2013/081957 dated Mar. 4, 2014 (2 pages).

Primary Examiner — Tulsidas C Patel
Assistant Examiner — Marcus Harcum
(74) Attorney, Agent, or Firm — Kilyk & Bowersox, P.L.L.C.

(57) ABSTRACT

The present invention intends to suppress a contact probe from interfering with a guide plate to produce shavings. The present invention has stacked structure that sandwiches an intermediate metallic layer 12 between outer metallic layers 11 and 13, and includes: a contact part 2 that is brought into abutting with a test object; an elastic deformation part 4 that is elastically deformed so as to be curved in a predetermine direction of curvature N by compression force in the longer direction; and a fore end part 3 that is formed between the contact part 2 and the elastic deformation part 4 and supported by a through-hole 121 of a guide plate 120 so as to make the contact part 2 movable in the longer direction, in which side surfaces of the fore end part 3 formed in the direction of curvature N and a direction N' opposite to the N (Continued)

of the elastic deformation part 4 are configured to include the three metallic layers 11 to 13, and on the side surfaces, the intermediate metallic layer 12 is configured to protrude relative to the outer metallic layers 11 and 13.

4 Claims, 24 Drawing Sheets

(58) Field of Classification Search
USPC ............... 439/700, 482; 324/754.14, 325
See application file for complete search history.

(56) References Cited

U.S. PATENT DOCUMENTS

| | | |
|---|---|---|
| 5,921,786 A | 7/1999 | Slocum et al. |
| 5,974,662 A | 11/1999 | Eldridge et al. |
| 5,977,787 A | 11/1999 | Das et al. |
| 7,629,807 B2 | 12/2009 | Hirakawa et al. |
| 7,731,546 B2 * | 6/2010 | Grube .............. G01R 1/06733 361/761 |
| 7,928,749 B2 | 4/2011 | Lou |
| 2007/0216432 A1 | 9/2007 | Kister |
| 2009/0280676 A1 * | 11/2009 | Weiland ............ G01R 1/06733 439/482 |
| 2015/0280345 A1 | 10/2015 | Kimura et al. |

FOREIGN PATENT DOCUMENTS

| | | |
|---|---|---|
| JP | 2012-173263 A | 9/2012 |
| JP | 2013-007700 A | 1/2013 |

* cited by examiner contact probe 101
Fig. 2A
Fig. 2B
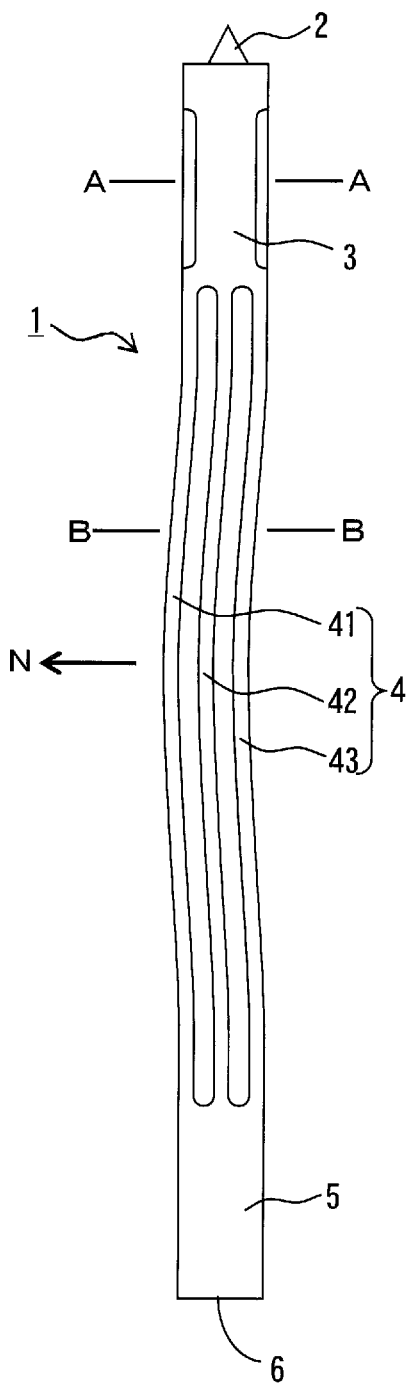
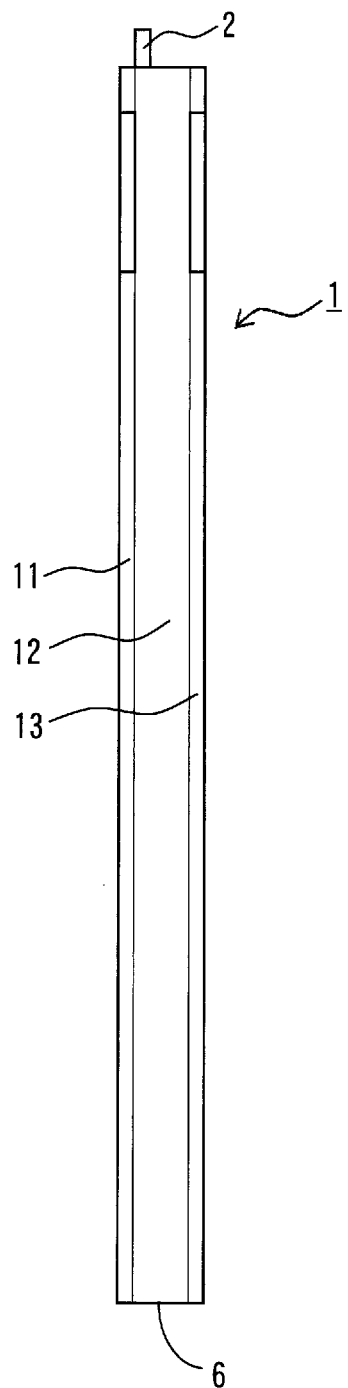

Fig. 3A illustration along A-A cutting plane line
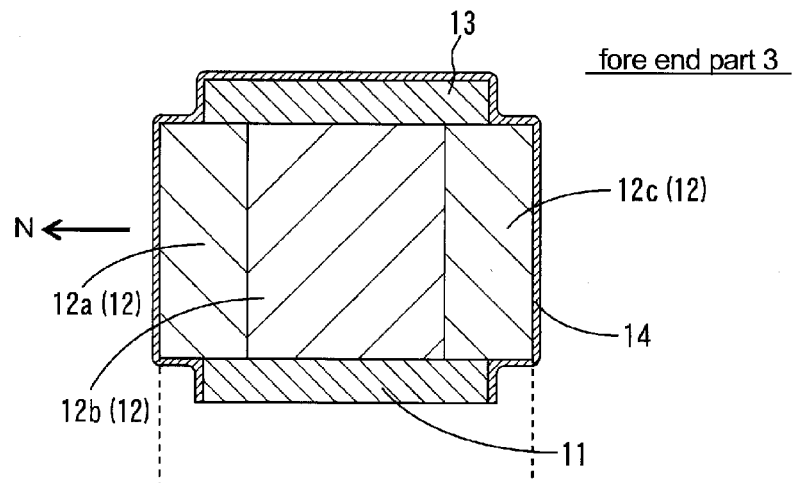
Fig. 3B illustration along B-B cutting plane line
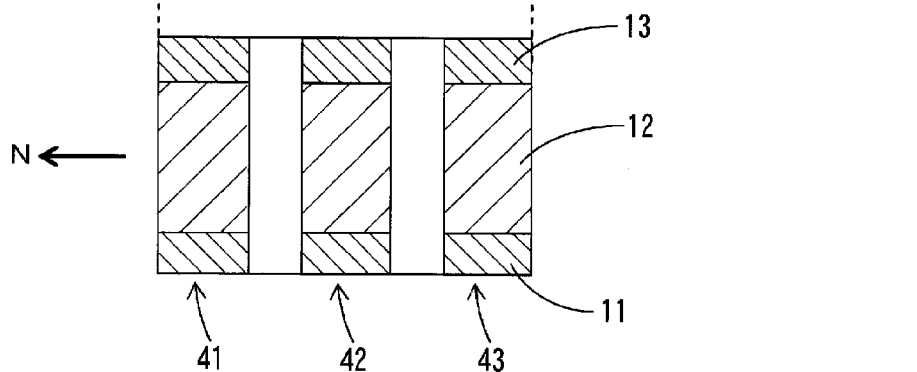

Fig. 5A a comparative example
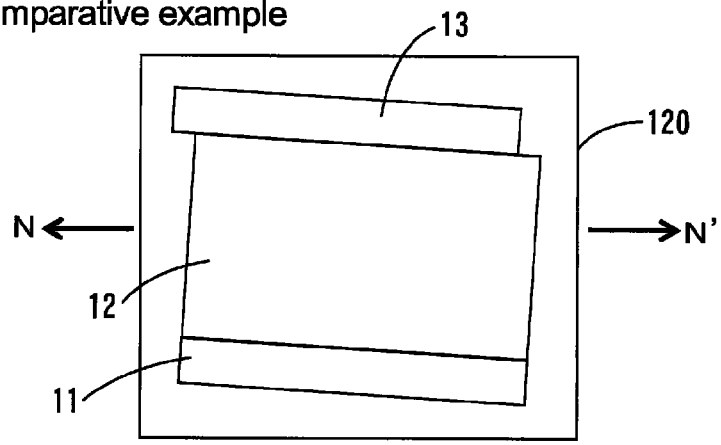
Fig. 5B
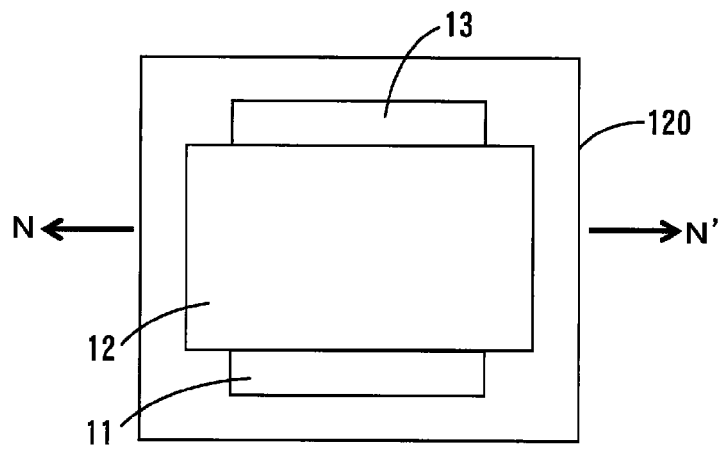
Fig. 5C
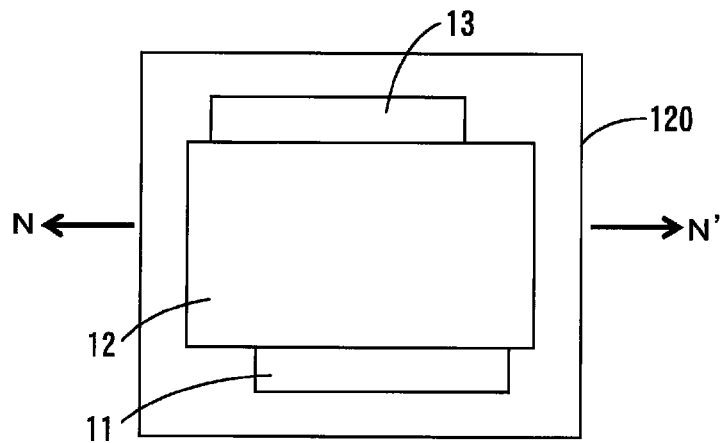

contact probe 102
Fig. 8A
Fig. 8B
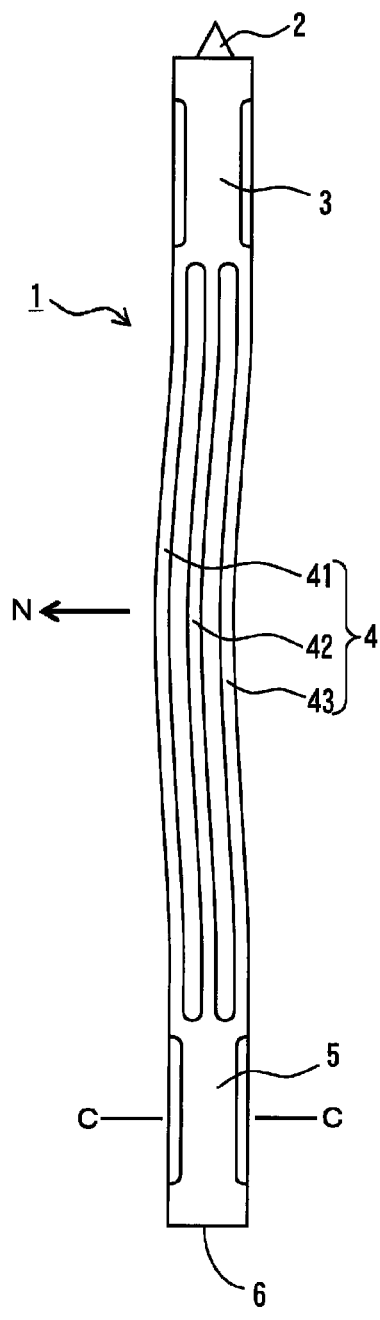
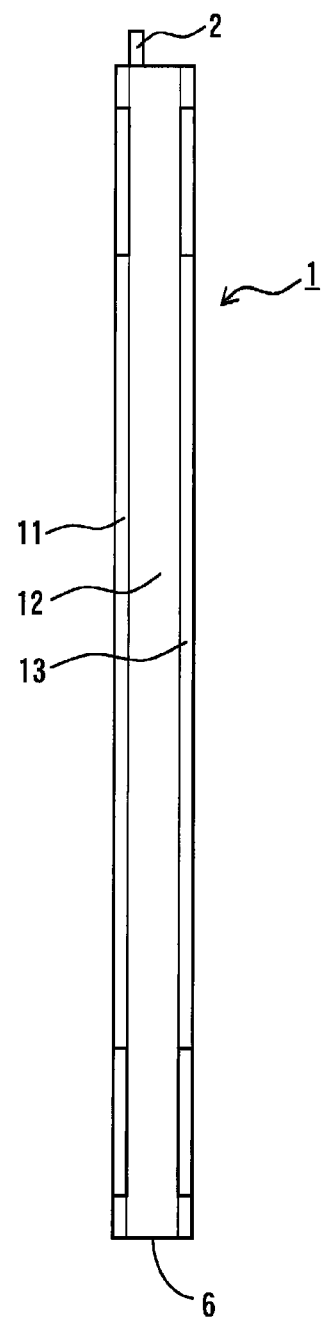

illustration along C-C cutting plane line contact probe 103
Fig. 11A
Fig. 11B
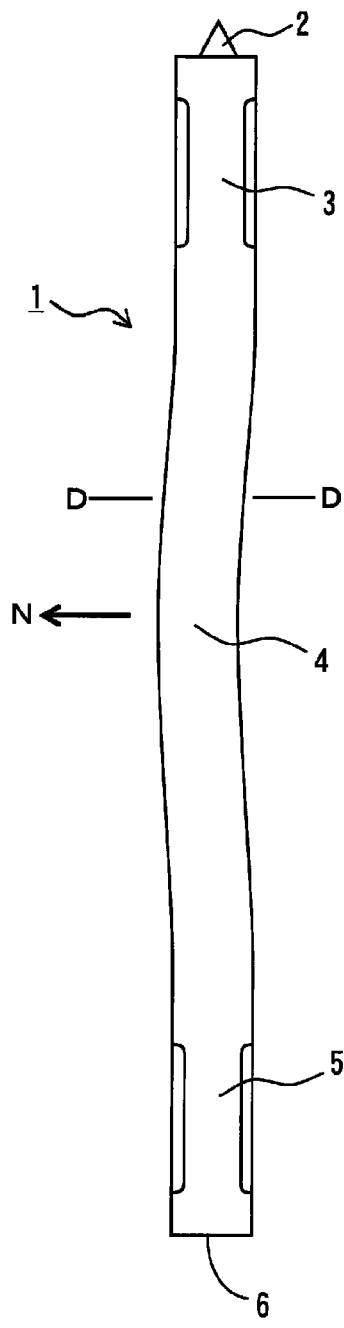
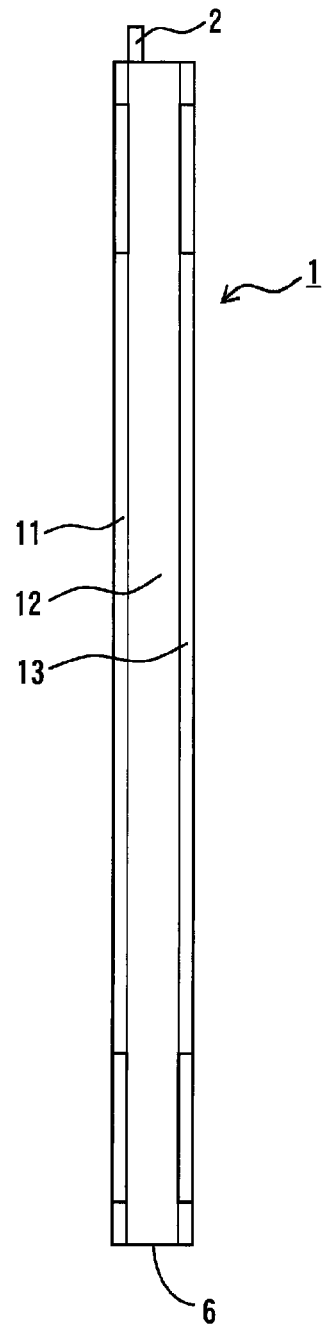

illustration along D-D cutting plane line

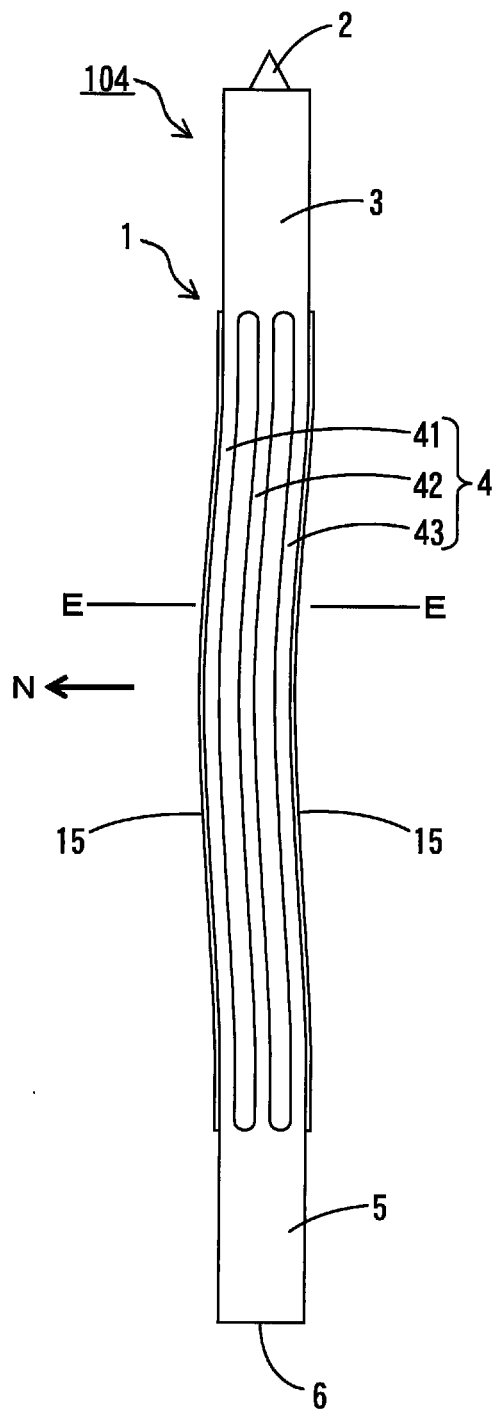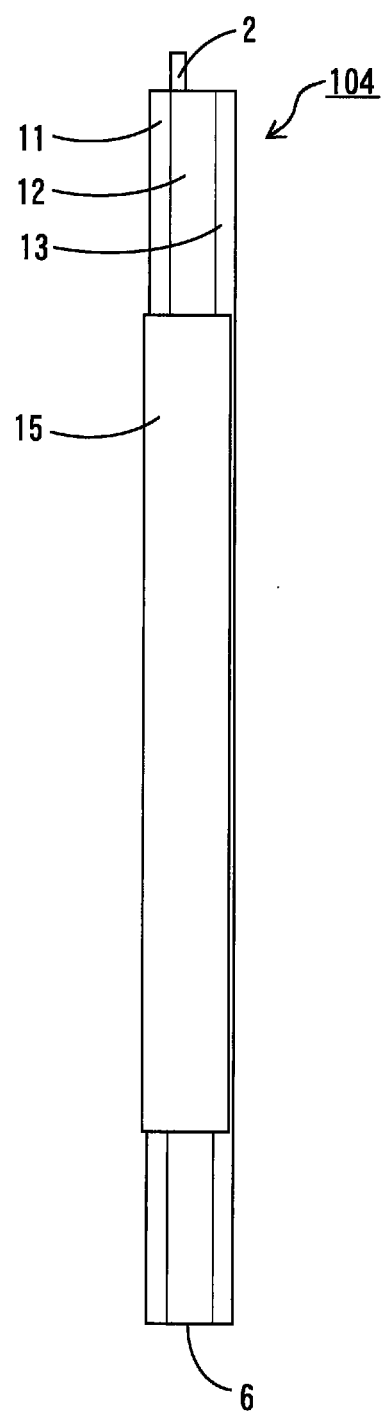

Fig. 20A
Fig. 20B
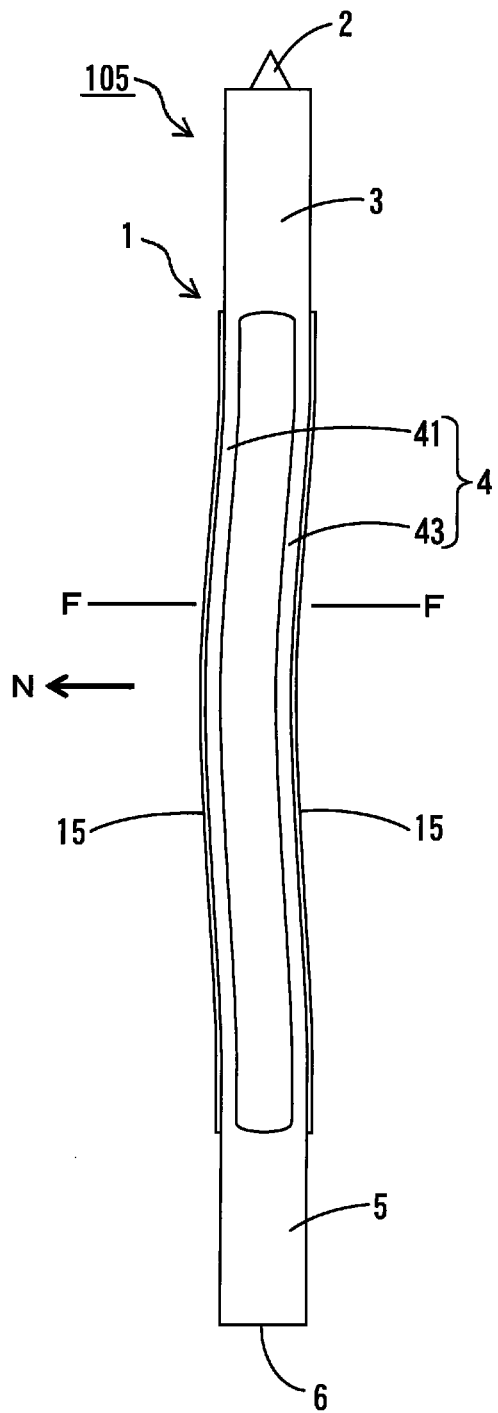
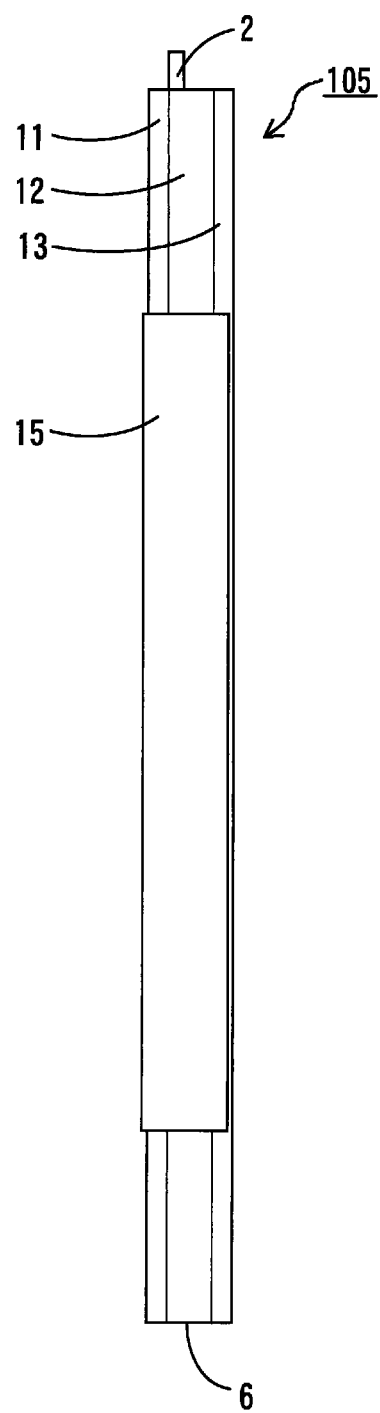

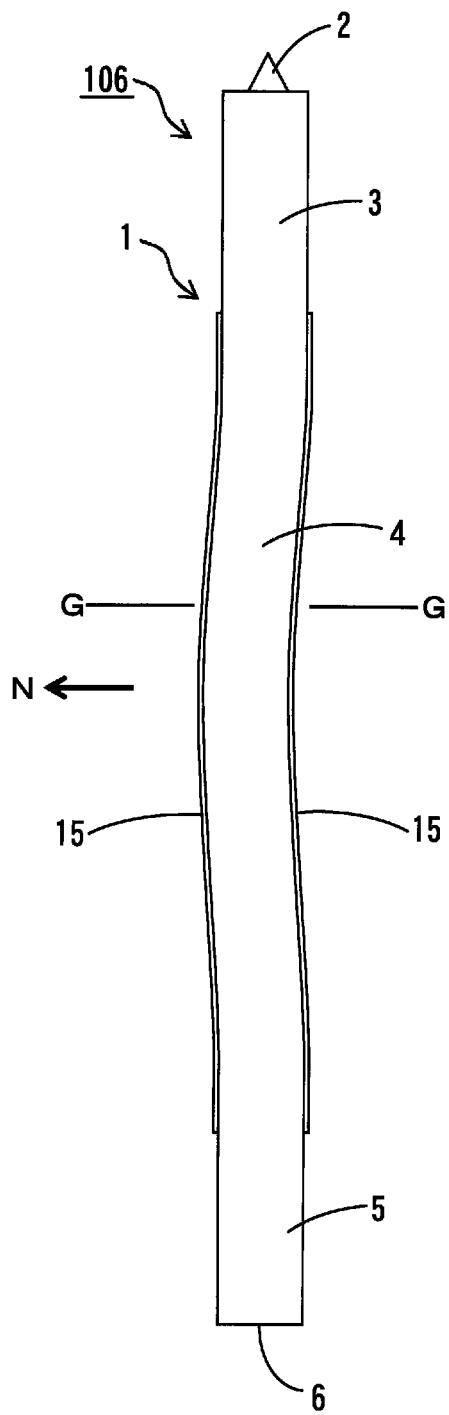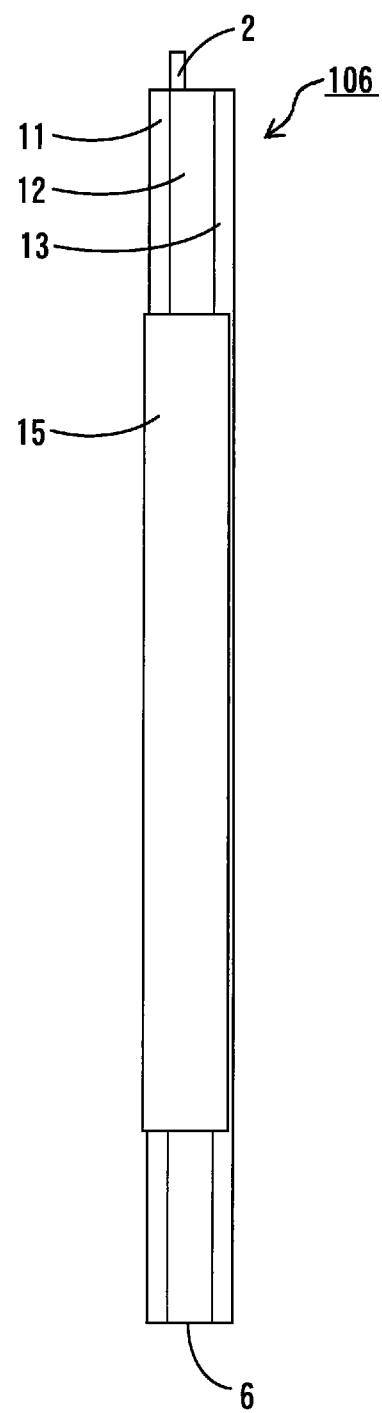

illustration along G-G cutting plane line contact probe 107

CONTACT PROBE

This application is a continuation of U.S. patent application Ser. No. 14/430,557, filed Mar. 24, 2015, which is a National Stage Application of PCT/JP2013/081957, filed Nov. 27, 2013, which claims priority to Japanese Patent Application No. 2012-265364, filed Dec. 4, 2012, and Japanese Patent Application No. 2013-001903 filed Jan. 9, 2013.

TECHNICAL FIELD

The present invention relates to an electrical contact, and more specifically, to improvement of an electrical contact of which a contact part is brought into contact with an electrode terminal along with elastic deformation of an elastic deformation part, for example, a contact probe used for an electrical characteristics test of semiconductor devices.

BACKGROUND ART

An electrical characteristics test of semiconductor devices is performed in such a way as to bring a semiconductor wafer close to a probe card of which a number of contact probes are formed on a wiring board, and thereby bring the respective contact probes into contact with corresponding electrode pads on the semiconductor wafer to input/output a test signal through the contact probes.

When bringing the contact probes into contact with the corresponding electrode pads, after the both reach a state of starting to contact with each other, a process to further bring the semiconductor wafer close to the probe card is performed. Such a process is called overdrive, and a distance of the overdrive is called an overdrive amount. The overdrive is a process to elastically deform the contact probes, and by performing the overdrive, even in the case where there are variations in height among the electrode pads or the contact probes, all of the contact probes can be surely brought into contact with the corresponding electrode pads.

The inventors of the present application proposed, in the previous patent application, a method for improving high frequency characteristics of a contact probe (Patent Literature 1). The contact probe described in Patent Literature 1 has an elastic deformation part including multiple elongate plate-like bodies of which adjacent principal surfaces face each other via a gap. Employing such a configuration makes it possible to shorten the length of the probe to improve the high frequency characteristics of the contact probe while ensuring an overdrive amount and probe pressure.

Also, the inventors of the present application proposed a method for further improving the above-described contact probe to improve current resistant characteristics of the contact probe (Patent Literature 2). In a contact probe described in Patent Literature 2, the above-described plate-like bodies have three-layer structure that sandwiches a conductive layer between stress layers in a width direction thereof. For this reason, current resistant characteristics can be improved while ensuring an overdrive amount, probe pressure, and high frequency characteristics.

CITATION LIST

Patent Literature

Patent Literature 1: JP-A2012-173263
Patent Literature 2: Japanese Patent Application No. 2011-141751

SUMMARY OF INVENTION

Technical Problem

This sort of contact probe is used in a state where the base end part is fixed to a wiring board, and also to make the fore end part movable in the longer direction, the vicinity of the fore end is supported by a guide plate. The guide plate has a through-hole through which the contact probe passes, and positions the fore end part in a two-dimensional plane. For this reason, at the time of overdrive, a side surface of the contact probe and a corresponding inner surface of the through-hole contact with each other, and any one of them is shaved to produce shavings. When such shavings are produced, the movement of the contact probe may be made difficult at the time of overdrive. In addition, in the case of shavings made of a conductive material, a short circuit may occur between adjacent contact probes.

The contact probe in Patent Literature 2 is configured such that the conductive layer is sandwiched between the stress layers, and therefore has side surfaces configured to include the three layers. Such side surfaces have a problem of easily causing a level difference to easily produce shavings. In particular, in the case of the contact probe in Patent Literature 2, a side surface facing in a curve direction is configured to include the three layers, and pressed against a corresponding inner surface of the through-hole at the time of overdrive, thus causing a problem of producing shavings. Also, when pressing the side surface having a level difference against the inner surface of the through-hole, the contact probe is twisted, thus causing a problem of reducing the accuracy of positioning by the guide plate. Further, since the contact probe is twisted, there is a problem of easily producing shavings.

Meanwhile, experiments by the inventors of the present application have revealed that by repetitively using the contact probe described in Patent Literature 2, unevenness is formed on the surfaces of the conductive layer to cause a rough state. This phenomenon is considered to be caused by repetitive plastic deformation of the conductive layer. At the time of overdrive, the stress layers are elastically deformed, whereas the conductive layer is plastically deformed. For this reason, it can be considered that when repetitively using the contact probe, the surfaces of the conductive layer repetitively plastically deformed are roughened.

As a result, for example, in the case of preventing a short circuit between contact probes by respectively forming insulating layers on the surfaces of conductive, the insulating layers formed on the conductive layers are broken or peeled off to cause a short circuit between the contact probes. That is, the surfaces of the conductive layers are roughened, causing a problem of reducing the durability of the contact probes.

Such a problem is a problem not only occurring in a contact probe used for an electrical characteristics test of semiconductor devices but common to electrical contacts of which contact parts are brought into contact with electrode terminals along with elastic deformation of elastic deformation parts, respectively.

The present invention is made in consideration of the above situations, and intends to provide an electrical contact that can be suppressed from interfering with a guide plate to produce shavings. Also, the present invention intends to suppress the electrical contact from interfering with the guide plate to be twisted.

In particular, the present invention intends to provide an electrical contact that is formed so as to include three or more layers and can suppress shavings from being produced due to a level difference on a side surface configured to include the three layers. Also, the present invention intends to suppress the electrical contact from being twisted due to the level difference to reduce the accuracy of positioning by a guide plate.

Further, the present invention intends to improve the durability of an electrical contact having three-layer structure that sandwiches a conductive layer between stress layers. Still further, the present invention intends to, without significantly reducing current resistant characteristics or overdrive characteristics, improve the durability of an electrical contact of which an elastic deformation part is divided into two or more plate-like bodies each of which has three-layer structure. Yet further, the present invention intends to prevent the occurrence of a short circuit between adjacently arranged electrical contacts.

Solution to Problem

An electrical contact according to a first aspect of the present invention includes: a contact part that is brought into abutting with a test object; a terminal part that is conducted to a wiring board; an elastic deformation part that is provided between said contact part and said terminal part, and elastically deformed by compression force in a longer direction; and a sliding part that is supported by a through-hole of a guide plate movably in the longer direction, wherein said sliding part has stacked structure of which an intermediate layer is sandwiched by outer layers and a stack surface extends in the longer direction, and on a side surface thereof, said intermediate layer protrudes relative to said outer layers.

Employing such a configuration makes it possible to press the intermediate layer against an inner surface of the through-hole of the guide plate at the time of overdrive without pressing the outer layers. For this reason, as compared with the case where the outer layers protrude relative to the intermediate layer, and the outer layers are pressed against an inner surface of the through-hole, the electrical contact can be suppressed from being twisted at the time of overdrive. Also, the electrical contact can be suppressed from being twisted to easily produce shavings at the time of sliding.

An electrical contact according to a second aspect of the present invention is, in addition to the above configuration, configured such that on said side surface of said sliding part, a plating layer is formed so as to cover the intermediate layer and the outer layers. Such a configuration makes it possible to round corner angles caused by level differences between the intermediate layer and the outer layers to make the side surface gentle. For this reason, a contact area in the case where a side surface of a fore end part slides on a corresponding inner surface of the through-hole while locally contacting with the inner surface can be increased. As a result, the production of shavings can be suppressed at the time of sliding.

An electrical contact according to a third aspect of the present invention is, in addition to the above configuration, configured such that said sliding part is formed between said contact part and said elastic deformation part. Such a configuration makes it possible to perform positioning of the contact part in a two-dimensional plane by the through-hole of the guide plate as well as preventing the electrical contact from being twisted at the time of overdrive. Further, shavings can be prevented from being easily produced at the time of sliding.

An electrical contact according to a fourth aspect of the present invention is, in addition to the above configuration, configured such that said sliding part is formed between said terminal part and said elastic deformation part. Such a configuration makes it possible to perform positioning of the terminal part in a two-dimensional plane by the through-hole of the guide plate as well as preventing the electrical contact from being twisted at the time of overdrive. Further, shavings can be prevented from being easily produced at the time of sliding.

An electrical contact according to a fifth aspect of the present invention is, in addition to the above configuration, configured such that said elastic deformation part includes an elongate plate-like body; and said plate-like body has a conductive layer made of a first metal, stress layers that are formed so as to sandwich said conductive layer in a width direction and made of a second metal, and a thin film layer that is formed so as to cover said conductive layer on a principal surface of said plate-like body and made of a third metal. In addition, the first metal has smaller resistivity than the second metal; and the second metal and the third metal have high mechanical strength as compared with the first metal.

By forming part of the electrical contact as the plate-like body, stress produced at the time of curving in the thickness direction of the plate-like body can be reduced. For this reason, a larger curve can be formed within an elastic limit to shorten the electrical contact while ensuring a desired overdrive amount. As a result, without reducing contact characteristics of the electrical contact, high frequency characteristics can be improved.

In addition, the plate-like body has the conductive layer and stress layers arrayed in the width direction thereof, and the conductive layer is made of the first metal having smaller resistivity, whereas the stress layers are made of the second metal having higher mechanical strength. Employing such a configuration makes it possible to reduce electrical resistance while keeping mechanical strength. For this reason, current resistant characteristics of the electrical contact can be improved while ensuring probe pressure at the time of overdrive. In addition, by arranging the conductive layer so as to sandwich the conductive layer between the stress layers, the plate-like body can be prevented from being twisted or tilted at the time of overdrive.

Further, the plate-like body has the thin film layer that is formed so as to cover the conductive layer on the principal surface of the plate-like body, and the thin film layer is made of the third metal having high mechanical strength as compared with the first metal. By employing such a configuration, the conductive layer that is plastically deformed at the time of overdrive is covered with the thin film layer that is elastically deformed at the time of overdrive, and therefore the principal surface of the plate-like body can be prevented from being roughened.

An electrical contact according to a sixth aspect of the present invention is, in addition to the above configuration, configured such that said elastic deformation part includes two or more of said plate-like bodies that are arranged so as to make adjacent principal surfaces face each other through a gap; and said plate-like bodies are mutually connected at both ends in the longer direction.

By providing the two or more plate-like bodies, and making adjacent principal surfaces of the plate-like bodies face to each other through a gap, the cross-sectional area of the electrical contact can be increased to ensure probe pressure and current resistant characteristics without increasing the thicknesses of the respective plate-like bodies.

An electrical contact according to a seventh aspect of the present invention is, in addition to the above configuration, configured such that said thin film layer is formed on outer principal surfaces of said plate-like bodies arranged on both sides, and not formed on the principal surfaces adjacent to said gap.

By employing such a configuration, as compared with the case of forming the thin film layer on both principal surfaces of the plate-like bodies, the intermediate metallic layer can be formed thicker to reduce the electrical resistance of the electrical contact as long as the thicknesses of the plate-like bodies are the same. Also, as compared with the case of forming the thin film layer on the outer principal surfaces, in the case of forming the thin film layer on the inner principal surfaces adjacent to the narrow gap, thickness control becomes difficult, so that by preventing the formation of the thin film layer on the inner principal surfaces, the electrical contact can be easily manufactured, and variations in characteristics of the electrical contact can be suppressed.

An electrical contact according to an eighth aspect of the present invention is, in addition to the above configuration, configured to include three or more of said plate-like bodies, in which said plate-like bodies have substantially the same thickness as each other.

Employing such a configuration makes it possible to, at the time of overdrive, uniformly distribute pressing force to the respective plate-like bodies, and deform the plate-like bodies so as to form substantially the same curved shape as each other. As a result, a larger overdrive amount can be ensured, and also the electrical contact can be suppressed from being tilted at the time of overdrive.

An electrical contact according to a ninth aspect of the present invention is, in addition to the above configuration, configured such that on said thin film layer, an insulating film is formed. Employing such a configuration makes it possible to prevent the breakage or peeling off of the insulating film caused by repetitive overdrive, and also prevent a short circuit between adjacent electrical contacts.

Advantageous Effects of Invention

According to the present invention, the electrical contact can be suppressed from interfering with the guide plate to thereby produce shavings. Also, the electrical contact can be suppressed from interfering with the guide plate to be twisted.

In particular, in the electrical contact formed so as to include three or more layers, the formation of a level difference on a side surface configured to include the three layers, and the production of shavings caused by the level difference can be suppressed. As a result, the electrical contact can be suppressed from becoming difficult to move due to shavings. Also, the occurrence of a short circuit between adjacent electrical contacts due to the production of conductive shavings can be prevented.

Further, the electrical contact can be suppressed from being twisted by the level difference to reduce the accuracy of positioning by the guide plate. In addition, the electrical contact can be suppressed from being twisted to thereby produce shavings.

Still further, according to the present invention, the durability of the electrical contact having three-layer structure that sandwiches the conductive layer between the stress layers can be improved. Also, the durability of the electrical contact of which the elastic deformation part is divided into the two or more plate-like bodies each of which has the three-layer structure can be improved without significantly reducing current resistant characteristics or overdrive characteristics. Further, the occurrence of a short circuit between adjacently arranged electrical contacts can be prevented.

BRIEF DESCRIPTION OF DRAWINGS

FIGS. 2A and 2B are side views of the contact probe 101 in FIG. 1.

FIGS. 3A and 3B are cross-sectional views of the contact probe 101 in FIG. 1.

FIGS. 5A-5C are views illustrating relationships between a cross-sectional shape of the fore end part 3 and the through-hole 121 in FIGS. 4A and 4B.

FIGS. 8A and 8B are appearance views illustrating a configuration example of a contact probe 102 according to Embodiment 2 of the present invention.

FIGS. 11A and 11B are appearance views illustrating a configuration example of a contact probe 103 according to Embodiment 3 of the present invention.

FIGS. 14A and 14B are side views of the contact probe 104 in FIG. 13.

FIGS. 20A and 20B are appearance views illustrating a configuration example of a contact probe 105 according to Embodiment 6 of the present invention.

FIGS. 22A and 22B are appearance views illustrating a configuration example of a contact probe 106 according to Embodiment 6 of the present invention.

DESCRIPTION OF EMBODIMENTS

Embodiment 1

Figure 1:
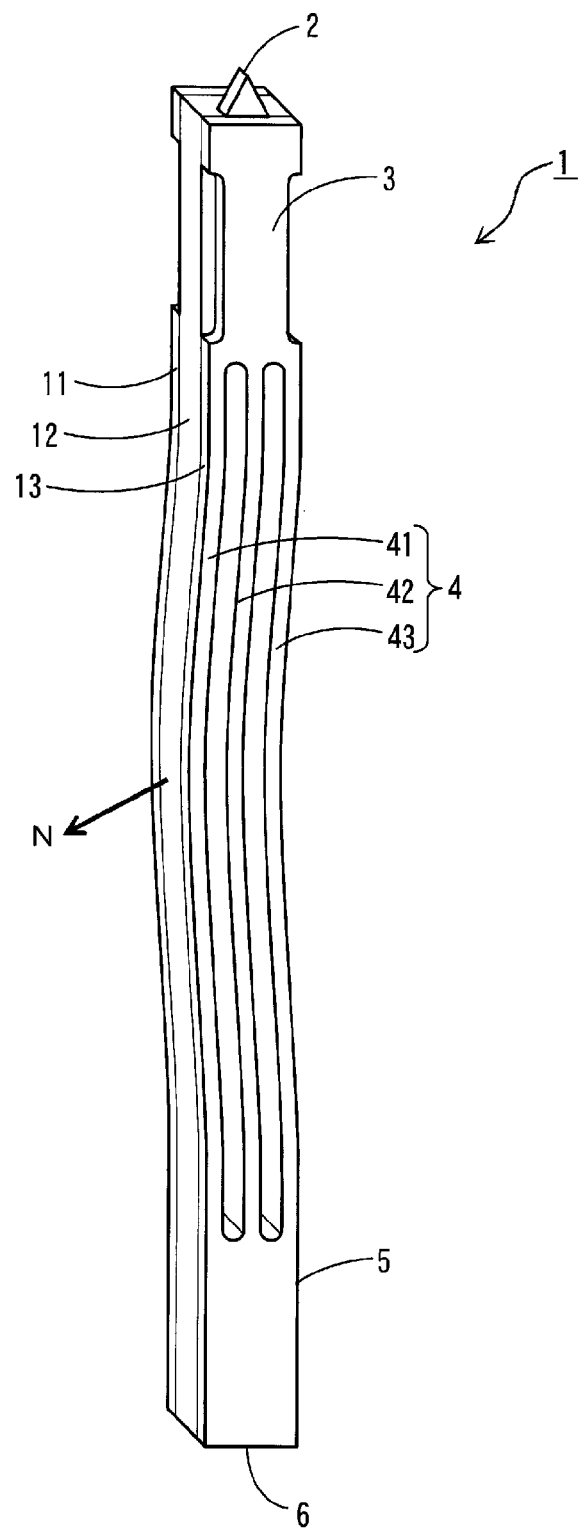
FIG. 1 is an appearance view illustrating a configuration example of a contact probe 101 according to Embodiment 1 of the present invention, in which a perspective view of the contact probe 101 is illustrated.

FIGS. 1 and 2A and 2B are appearance views illustrating a configuration example of a contact probe 101 according to Embodiment 1 of the present invention. FIG. 1 is a perspective view of the contact probe 101, and FIGS. 2A and 2B are side views respectively illustrating different side surfaces of the contact probe 101. The contact probe 101 is a probe used for an electrical characteristics test of semiconductor devices, and illustrated as an example of an electrical contact.

The contact probe 101 is a vertical type probe arranged vertically to a test object, and configured to include: a main body part 1 of a substantially linear elongate shape; a contact part 2 formed at the fore end of the main body part 1; and a terminal part 6 provided at the base end of the main body part 1. The main body part 1 has stacked structure including three metallic layers 11 to 13, and the respective metallic layers 11 to 13 of which stack surfaces all extend along the longer direction of the main body part 1 are formed from the base end to the fore end of the main body part 1. In addition, the metallic layers 11 to 13 are formed sequentially stacked, and the intermediate metallic layer 12 is sandwiched by the outer metallic layers 11 and 13. The contact part 2 is an abutting part that is brought into abutting with a test target, and formed so as to protrude from the fore end of the main body part 1. The terminal part 6 is provided on the end surface of the base end of the main body part 1.

The main body part 1 is configured to include: an elongate-shaped elastic deformation part 4 that is elastically deformed at the time of overdrive; and a fore end part 3 and a base end part 5 that are formed on both sides of the elastic deformation part 4. At the end of the fore end part 3, the contact part 2 is formed, and at the end of the base end part 5, the terminal part 6 is formed. The terminal part 6 is fastened to an unillustrated wiring board, and the elastic deformation part 4 is of a shape that is easily bucklingly deformed by being applied with compression force in the longer direction thereof. For this reason, at the time of overdrive, in response to reaction force from the test object, the elastic deformation part 4 is bucklingly deformed, and thereby the contact part 2 is moved backward toward the base end part 5 side.

The elastic deformation part 4 is formed to include three beam parts 41 to 43 of which adjacent ones are arranged through a gap. The respective beam parts 41 to 43 are all formed as elongate plate-like bodies, and arranged so as to make adjacent principal surfaces face each other. Also, one ends of the beam parts 41 to 43 in the longer direction are connected by the fore end part 3, and the other ends are connected by the base end part 5.

Forming the beam parts 41 to 43 as the plate-like bodies makes it easier to deform the beam parts 41 to 43 in their thickness direction, and when applied with compression force in the longer direction, the beam parts 41 to 43 are easily bucklingly deformed. That is, at the time of overdrive, the beam parts 41 to 43 are deformed so as to be curved using the whole thereof in the longer direction, and therefore can be elastically deformed largely even by small compression force. Accordingly, as compared with the length of the beams, a large overdrive amount can be ensured.

However, in the case of forming each of the beams 41 to 43 in the easily elastically deformable shape, reaction force at the time of elastic deformation also becomes small, and therefore it becomes difficult to ensure pressing force (probe pressure) of the contact part 2 against the test object. For this reason, the elastic deformation part 4 is configured to include the two or more beam parts 41 to 43, and the sum of reaction forces of the respective beam parts 41 to 43 is used as probe pressure, whereby even in the case where the reaction force of each of the beam parts 41 to 43 is small, the large probe pressure can be ensured. That is, by dividing the elastic deformation part 4 into the two or more beam parts 41 to 43, as well as forming the respective beam parts 41 to 43 as the plate-like bodies and arranging them such that adjacent principal surfaces face each other, the length of the probe can be shortened while ensuring both of an overdrive amount and probe pressure. Accordingly, without reducing contact characteristics, high frequency characteristics can be improved.

Further, in the case of dividing the elastic deformation part 4 into the three beam parts 41 to 43, a cross section area is reduced to thereby cause a problem of reducing current resistant characteristics. For this reason, by forming the beam parts 41 to 43 from the three metallic layers 11 to 13, the resistivity of the elastic deformation part 4 is reduced. The metallic layers 11 to 13 are layers that divide the beam parts 41 to 43 in the width direction, any of which is made of conductive metal; however, the outer metallic layers 11 and 13 and the intermediate metallic layer 12 are formed of mutually different materials. The outer metallic layers 11 and 13 are stress layers using a metallic material having higher mechanical strength, whereas the intermediate metallic layer 12 is a conductive layer using a metallic material having smaller resistivity. Employing such a configuration that sandwiches the conductive layer between the two stress layers makes it possible to reduce resistance to improve the current resistant characteristics without increasing the cross section area of the beam parts 41 to 43.

It is generally known that the moment of inertia of area of a leaf spring is proportional to the width of the leaf spring, and also proportional to the cube of the thickness of the leaf spring. For this reason, buckling deformation characteristics of the beam parts 41 to 43 are substantially determined by the thicknesses of the beam parts 41 to 43, and the effect caused by adding the intermediate metallic layer 12 to form the three-layer structure can be balanced out by finely adjusting the thicknesses of the beam parts 41 to 43.

Further, the beam parts 41 to 43 are of a gently curved shape before overdrive, and at the time of overdrive, bucklingly deformed so as to increase the curvature of the curved shape. Accordingly, direction of curvatures N of the beam parts 41 to 43 are all predetermined, and coincident with one another. In addition, a direction that is a thickness direction of the beam parts 41 to 43 and faces toward the outside of the curved shape is herein referred to as the direction of curvature N.

FIGS. 3A and 3B are cross-sectional views illustrating a configuration example of the contact probe 101 in FIG. 1, in which FIG. 3A illustrates a cross section when cutting the fore end part 3 aloft an A-A cutting plane line in FIGS. 2A and 2B, and FIG. 3B illustrates a cross section when cutting the elastic deformation part 4 along a B-B cutting plane line in FIGS. 2A and 2B. Note that the A-A cutting plane line and the B-B cutting plane line are cutting plane lines both orthogonal to the longer direction of the contact probe 101.

The fore end part 3 and the elastic deformation part 4 are both configured to include the metallic layers 11 to 13, and the metallic layers 11 to 13 all have rectangular-shaped cross sections. In addition, the intermediate metallic layer 12 is thicker than the outer metallic layers 11 and 13.

The beam parts 41 to 43 included in the elastic deformation part 4 all have rectangular-shaped cross sections, and the cross sections have the thicknesses that are small as compared with corresponding widths, and are arranged in line at regular intervals in the thickness direction. Regarding the cross sections of the respective beam parts 41 to 43, the thicknesses are substantially the same, and the widths are also substantially the same. That is, the cross sections have substantially the same shape and size.

Employing such a configuration makes it possible to uniformly distribute the pressing force at the time of overdrive to the respective beam parts 41 to 43, and deform the beam parts 41 to 43 so as to form substantially the same curved shape as each other. As a result, within an elastic limit, a larger overdrive amount can be ensured, and also the contact probe 101 can be suppressed from being tilted.

Also, the beam parts 41 to 43 are configured by arraying the three metallic layers 11 to 13 in the width direction thereof so as to sandwich the intermediate metallic layer 12 between the outer metallic layers 11 and 13. For example, for the outer metallic layers 11 and 13, a nickel cobalt alloy (Ni—Co) is used, whereas for the intermediate metallic layer 12, gold (Au) is used. Gold (Au) has low mechanical strength and small resistivity as compared with the nickel cobalt alloy (Ni—Co). For this reason, by using gold (Au) for the intermediate metallic layer 12, the electrical resistance of the beam parts 41 to 43 can be reduced without increasing the thickness Lt of the beam parts 41 to 43. That is, without spoiling the ease of the buckling deformation, the electrical resistance of the beam parts 41 to 43 can be reduced.

Further, the outer metallic layers 11 and 13 have substantially the same width, and the metallic layers 11 to 13 are formed symmetrically in the width direction of the beam parts 41 to 43. For this reason, when applied with pressing force in the longer direction, the beam parts 41 to 43 are respectively deformed in a balanced manner, and can be suppressed from being tilted or twisted at the time of overdrive.

The fore end part 3 is also configured by sandwiching the intermediate metallic layer 12 between the outer metallic layers 11 and 13 in the same manner, but different from the elastic deformation part 4 in that the intermediate metallic layer 12 is formed so as to protrude relative to the outer metallic layers 11 and 13 and the fore end part 3 has a cross-shaped cross section. The length of each of the protrusions of the intermediate metallic layer 12 is only required to be at a level that can prevent reversal caused by variations in a manufacturing process. That is, it is only necessary that the intermediate metallic layer 12 protrudes relative to any of the outer metallic layers 11 and 13, and the length of the protrusion is arbitrary.

Also, the intermediate metallic layer 12 is different from the elastic deformation part 4 in that the intermediate metallic layer 12 is configured to include three metallic areas 12a to 12c arrayed in the direction of curvature N. That is, the three metallic areas 12a to 12c are formed so as to sandwich the central metallic area 12b between the metallic areas 12a and 12c on both sides. The outer metallic layers 11 and 13 of the fore end part 3 is made of the same material as that of the outer metallic layers 11 and 13 of the elastic deformation part 4, and formed simultaneously with these metallic layers. On the other hand, the intermediate metallic layer 12 of the fore end part 3, i.e., the metallic areas 12a to 12c are made of metallic materials different from that of the intermediate metallic layer 12 of the elastic deformation part 4. For example, for the central metallic area 12b, relatively low-cost copper (Cu) having small resistivity is used, and for the metallic areas 12a and 12c on both sides, a palladium cobalt (Pd—Co) alloy having high mechanical strength is used.

Further, on the outer circumferential surface of the fore end part 3, a thin film layer 14 is formed. For the thin film layer 14, a metallic material having higher abrasion resistant characteristics than the nickel alloy contained in the fore end part 3, for example, rhodium (Rh) is used. In addition, the thin film layer 14 includes, for example, a plating layer formed by an electroplating process. Forming such a thin film layer 14 makes it possible to suppress conductive shavings from being produced from a side surface of the fore end part 3. Further, by forming the thin film layer 14, and thereby rounding corner parts caused by level differences between the metallic layers 11 to 13 to make changes of the side surfaces of the fore end part 3 gentle, the production of shavings can be further effectively suppressed. Note that in this example, on the principal surface of the outer metallic layer 11, the thin film layer 14 is not formed due to manufacturing process reason; however, the thin film may be formed on all of the side surfaces of the fore end part 3 including the above principal surface.

Figure 4:
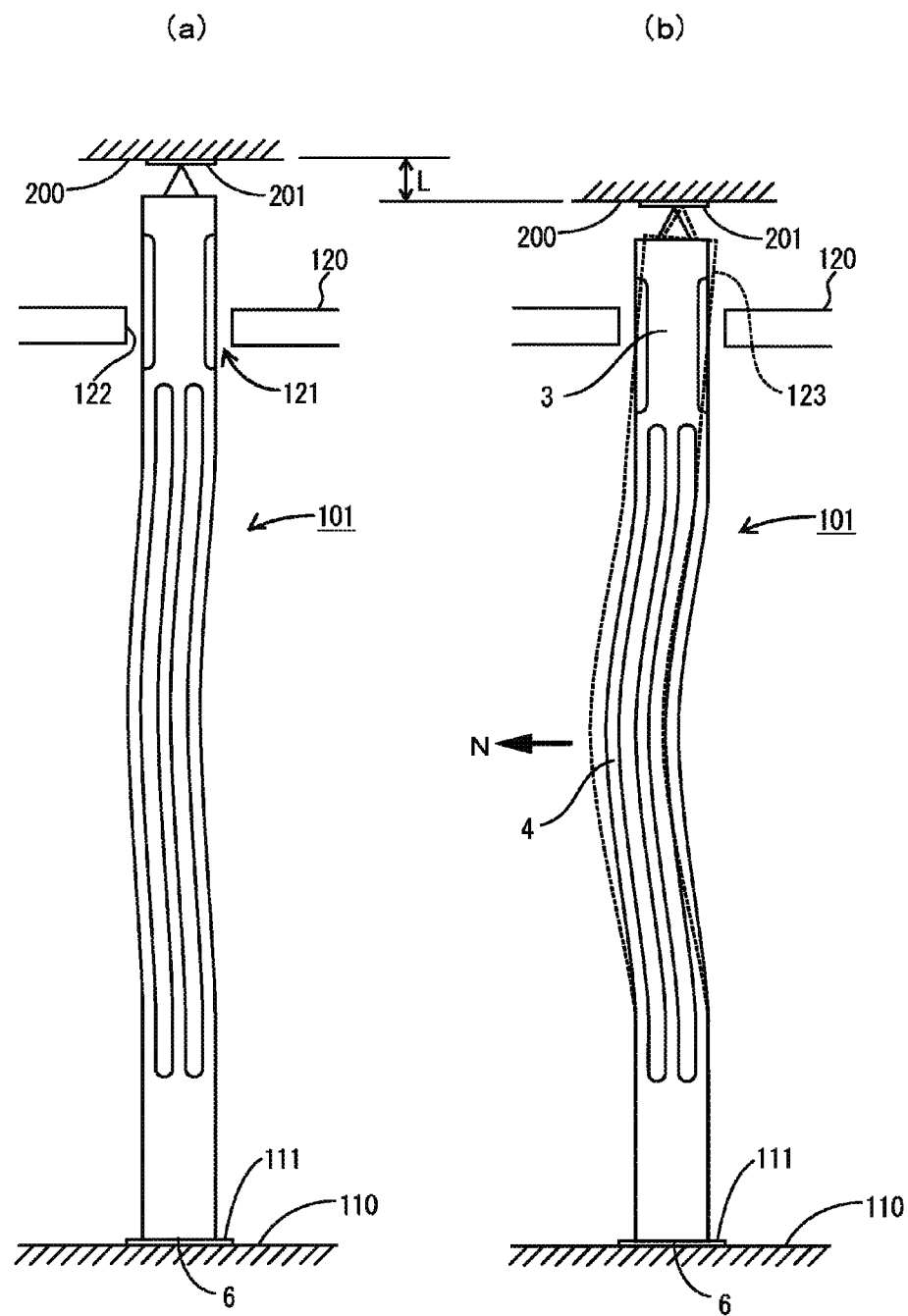
FIGS. 4A and 4B are explanatory views schematically illustrating a situation where the contact probe 101 in FIG. 1 is used to perform an electrical characteristics test.

FIGS. 4A and 4B are explanatory views schematically illustrating a situation where the contact probe 101 in FIG. 1 is used to perform an electrical characteristics test. In addition, a wiring board 110 and a guide plate 120 in the diagram are well-known components included in a probe card, and a semiconductor wafer 200 is an example of the test object.

The terminal part 6 of the contact probe 101 is fastened to a probe electrode 111 on the wiring board 110. Also, the fore end part 3 is supported movably in the longer direction by the guide plate 120. For the guide plate 120, for example, a silicon substrate is used, and a through-hole 121 corresponding to the contact probe 101 is formed. The contact probe 101 is arranged in a state of passing through the through-hole 121 such that the side surfaces of the fore end part 3 face corresponding inner surfaces 122 of the through-hole 121. For this reason, the fore end part 3 is positioned in a two-dimensional plane parallel to the guide plate 120 while keeping the state of being movable in the longer direction.

On the semiconductor wafer 200, a number of semiconductor devices are formed, and in addition, each of the semiconductor devices is formed with a number of electrode terminals 201. When performing the electrical characteristics test of the semiconductor devices, the contact probe 101 is arranged substantially vertically to the semiconductor wafer 200, and used with the tip thereof brought into abutting with an electrode terminal 201.

FIG. 4A illustrates a state where the wiring board 110 and the semiconductor wafer 200 are brought close to each other, and the contact part 2 starts to contact with an electrode terminal 201, i.e., a situation just before overdrive. In this state, the contact probe 101 is not elastically deformed, but of the predetermined gently-curved shape.

FIG. 4B illustrates a state where the wiring board 110 and the semiconductor wafer 200 are further brought close to each other from the state in FIG. 4A by a distance L, i.e., a situation after the overdrive. The contact probe 101 after the overdrive is elastically deformed in response to reaction force from the electrode terminal 201. When comparing the state in FIG. 4B with the state in FIG. 4A, the vicinity of the center of the elastic deformation part 4 is displaced in the direction of curvature N, and the elastic deformation part 4 is elastically deformed so as to increase the curvature of the curved shape. The direction of curvature N is a direction of bowing the elastic deformation part 4 that is perpendicular to the longitudinal direction of the elastic deformation part 4. Also, along with the elastic deformation, the fore end part 3 is moved backward by the distance L. Further, after that, by releasing the overdrive, the fore end part 3 is moved forward by the distance L and restored to the state in FIG. 4A.

That is, at the time of the overdrive, a side surface of the fore end part 3 slides on a corresponding inner surface 122 of the through-hole 121. In addition, along with the elastic deformation of the elastic deformation part 4, force attempting to displace the fore end part 3 in the direction of curvature N or a direction N' opposite to the N, or tilt 123 the fore end part 3 acts. As a result, the fore end part 3 is a sliding part that slides in a state of being pressed against the inner surface 122 of the through-hole 121 in the direction of curvature N or the opposite direction N'.

FIGS. 5A-5C are views illustrating relationships between the cross-sectional shape of the fore end part 3 and the through-hole 121 in FIGS. 4A and 4B. FIG. 5A in the diagram is a diagram illustrating a comparative example to be compared with the present invention, and FIGS. 5B and 5C are diagrams illustrating examples of the contact probe 101 according to the present embodiment.

The through-hole 121 has a rectangular-shaped opening, and the inner surfaces 122 thereof face corresponding outer surfaces of the fore end part 3 so as to be substantially parallel to the outer surfaces. That is, in the direction of curvature N and the opposite direction N', two surfaces facing corresponding end surfaces of the intermediate metallic layer 12 are provided, and in the directions intersecting with the direction of curvature N, two surfaces respectively facing the outer metallic layers 11 and 13 are provided.

FIG. 5A illustrates an example of a fore end part 3 to be compared with the present invention. In the fore end part 3, an outer metallic layer 13 protrudes relative to an intermediate metallic layer 12 in the direction of curvature N. In this case, inside the through-hole 121, the fore end part 3 is easily twisted to reduce the accuracy of positioning of the tip of a contact probe 101 by the guide plate 120. Also, even in the case where the contact probe 101 is not twisted, the thickness of the outer metallic layer 13 is thin as compared with the intermediate metallic layer 12, and a contact area at the time of sliding is small, thus easily producing shavings.

As described above, at the time of overdrive, the fore end part 3 slides in the state of being pressed against an inner surface 122 of the through-hole 121 in the direction of curvature N or the opposite direction N' of the elastic deformation part 4. For this reason, as in FIG. 5A, in the case where the outer metallic layer 11 distant from the center of the contact probe 101 protrudes relative to the intermediate metallic layer 12 including the center, the fore end part 3 is easily twisted inside the through-hole 121. In addition, since the contact probe 101 is twisted, the contact area at the time of sliding becomes small, and shavings are easily produced.

FIG. 5B illustrates the fore end part 3 having the cross-shaped cross section as in FIG. 2A. The fore end part 3 is formed such that the intermediate metallic layer 12 protrudes relative to the outer metallic layers 11 and 13. For this reason, at the time of overdrive, an end surface of the intermediate metallic layer 12 and a corresponding inner surface 122 of the through-hole 121 slide on each other while facing each other in the direction of curvature N or the opposite direction N'. Accordingly, such sliding does not cause a tilt or twist of the contact probe 101, and therefore production of shavings can also be suppressed.

FIG. 5C illustrates a fore end part 3 in which variations in a manufacturing process cause variations in protrusion amounts of an intermediate metallic layer 12 relative to outer metallic layers 11 and 13 as compared with the case in FIG. 5B. Even in the case where the variations in protrusion amounts of the intermediate metallic layer 12 occur, as long as the intermediate metallic layer 12 is formed so as to protrude relative to the outer metallic layers 11 and 13, a situation where an end surface of the intermediate metallic layer 12 and a corresponding inner surface 122 of the through-hole 121 slide on each other is the same as that in the case in FIG. 5B.

The contact probe 101 is formed with the metallic layers 11 to 13 on the side surfaces thereof in the direction of curvature N and the opposite direction N'. In the case where the side surfaces are planarized with high accuracy so as to prevent any level difference between the metallic layers 11 to 13 from being formed, the problem as in FIG. 5A does not occur. However, between such metallic layers 11 to 13, variations in a manufacturing process may cause a level difference. For this reason, by designing the intermediate metallic layer 12 so as to protrude the intermediate metallic layer 12 relative to the outer metallic layers 11 and 13 such that the lengths of the protrusions exceed a manufacturing error, the problem occurring in the state as in FIG. 5A can be suppressed from occurring.

FIGS. 6A-6D and 7A-7D are explanatory views illustrating an example of a method for manufacturing the contact probe 101 in FIG. 1. The contact probe 101 is manufactured using so-called MEMS (Micro Electro Mechanical Systems) technology. The MEMS technology is a technology to prepare a microscopic three-dimensional structure using a photolithography technique and a sacrifice layer etching technique. The photolithography technique is a micropattern processing technique using a photoresist utilized in a semiconductor manufacturing process and the like. Also, the sacrifice layer etching technique is a technique to prepare a three-dimensional structure by forming an underlayer called a sacrifice layer, forming a layer for making a structure on the sacrifice layer, and then removing only the sacrifice layer by etching.

For formation processes of respective layers including the sacrifice layer, a well-known plating technique can be utilized. For example, by immersing a substrate as a cathode and a metal piece as an anode into an electrolytic solution, and applying voltage between the both electrodes, metal ions in the electrolytic solution can be deposited on the surface of the substrate. Such a process is called an electroplating process, which is a wet process in which the substrate is immersed into the electrolytic solution, and therefore after the plating process, a drying process is performed. Further, after the drying process, a planarization process to planarize a stacked surface by a polishing process or the like is performed as needed.

Figure 6A:
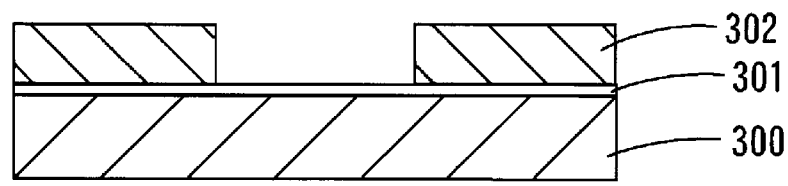
FIGS. 6A-6D are explanatory views illustrating an example of a method for manufacturing the contact probe 101 in FIG. 1.

FIG. 6A illustrates a state where a resist pattern for forming the outer metallic layer 11 is formed on a conductive substrate. On the entire upper surface of a silicon substrate 300, a seed film 301 is preliminarily formed. The seed film 301 is a thin film made of conductive metal such as Cu. The resist pattern is formed by forming a resist film 302 made of a photoresist on the seed film 301, and selectively removing the resist film only in an area corresponding to the outer metallic layer 11.

Figure 6B:
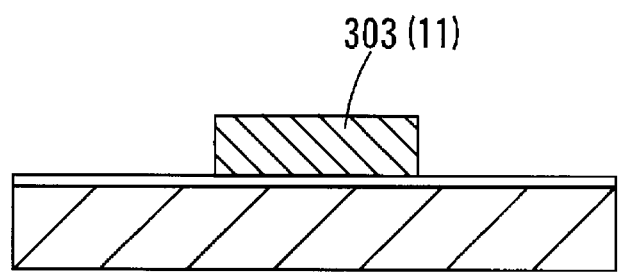

FIG. 6B illustrates a state where a conductive metallic layer 303 is formed in the area where the resist film 302 is not formed, and the resist film 302 is removed. The conductive metallic layer 303 is a layer corresponding to the outer metallic layer 11, and formed by utilizing electroplating to deposit conductive metal such as a Ni-based alloy in the area where the resist film 302 is not formed.

Figure 6C:
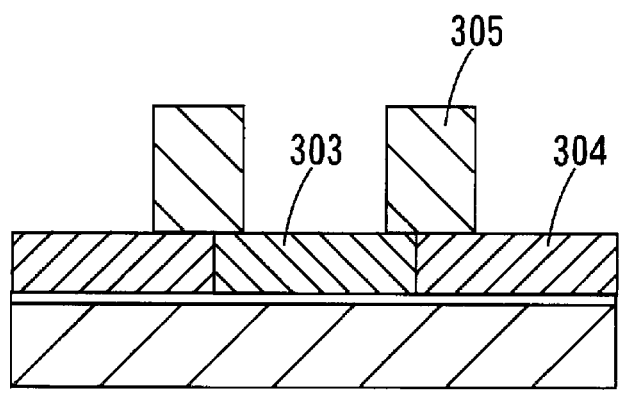

FIG. 6C illustrates a state where a sacrifice layer 304 is formed after the removal of the resist film 302, and a resist pattern adapted to mask the metallic areas 12a and 12c on both sides is formed. The sacrifice layer 304 is formed on the silicon substrate 300 after the removal of the resist film 302 by utilizing electroplating to deposit sacrifice metal such as Cu. The resist pattern is formed by forming a resist film 305 on the silicon substrate 300, and selectively removing the resist film in areas other than the metallic areas 12a and 12c on both sides.

Figure 6D:
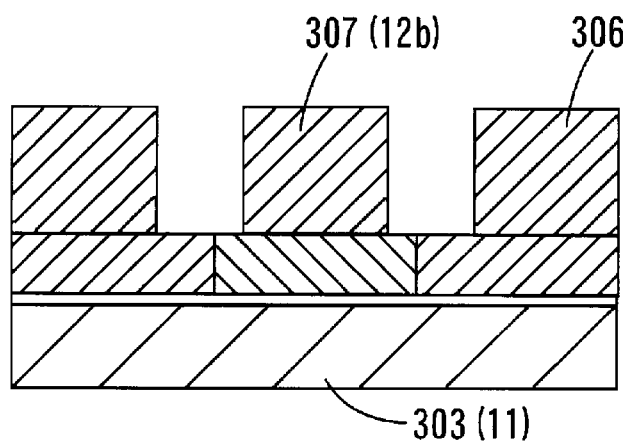

FIG. 6D illustrates a state where a sacrifice layer 306 and a conductive metallic layer 307 are formed in the areas where the resist film 305 is not formed, and then the resist film 305 is removed. The sacrifice layer 306 and the conductive metallic layer 307 are formed by utilizing electroplating to deposit conductive metal such as Cu in the areas where the resist film 305 is not formed. Note that the conductive metallic layer 307 corresponds to the central metallic area 12b, which is made of the same metallic material as that of the sacrifice layer 306 and formed simultaneously with the sacrifice layer 306.

Figure 7A:
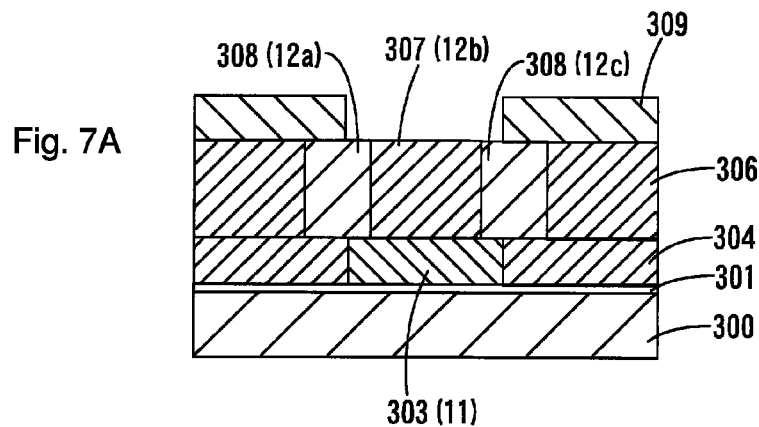
FIGS. 7A-7D are explanatory views illustrating the example of the method for manufacturing the contact probe 101 in FIG. 1.

FIG. 7A illustrates a state where a conductive metallic layer 308 is formed in areas where neither the sacrifice layer 306 nor the conductive metallic layer 307 is formed, and then a resist pattern form forming the outer metallic layer 13 is formed. The conductive metallic layer 308 corresponds to the metallic areas 12a and 12c on both sides, and formed by utilizing electroplating to deposit conductive metal such as a Ni-based alloy in the areas where neither the sacrifice layer 306 nor the conductive metallic layer 307 is formed. The resist pattern is formed by forming a resist film 309 and selectively removing the resist film only in an area corresponding to the outer metallic layer 13.

Figure 7B:
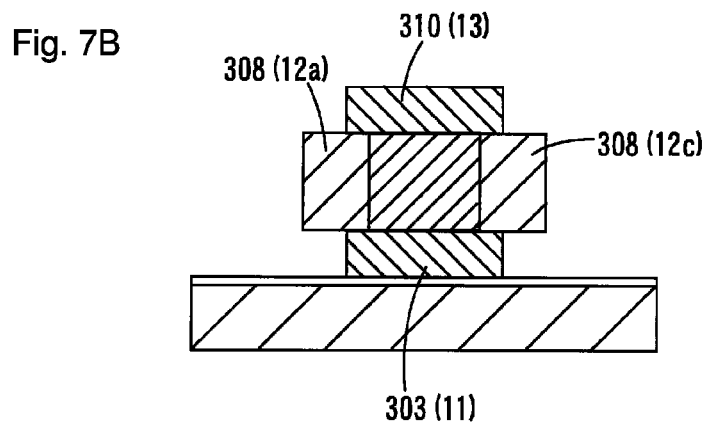

FIG. 7B illustrates a state where a conductive metallic layer 310 is formed in the area where the resist film 309 is not formed, and then the sacrifice layers 304 and 306 and the resist film 309 are removed. The conductive metallic layer 310 is a layer corresponding to the outer metallic layer 13, and formed by utilizing electroplating to deposit conductive metal such as a Ni-based alloy in the area where the resist film 309 is not formed. Note that the conductive metallic layer 307 is made of the same metallic material as that of the sacrifice layers 304 and 306; however, the conductive metallic layer 307 is surrounded by the conductive metallic layers 303, 308, and 310 and unexposed, and therefore immersing into an etching solution makes it possible to leave the conductive metallic layer 307 and remove only the sacrifice layers 304 and 306.

Figure 7C:
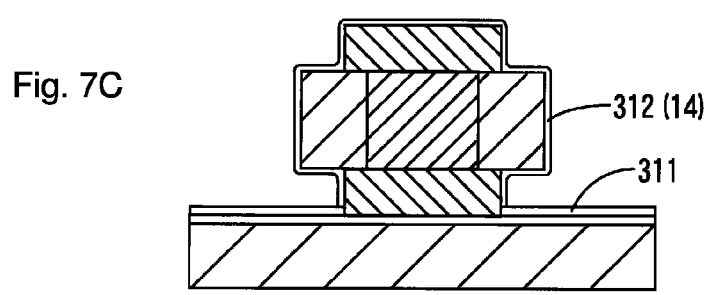

FIG. 7C illustrates a state where an insulating film 311 is formed on the seed film 301, and then a conductive metallic layer 312 is formed on exposed surfaces of the fore end part 3. The insulating film 311 is formed by sputtering. The conductive metallic film 312 forms a layer corresponding to the thin film layer 14 of the fore end part 3, and is formed by utilizing electroplating to deposit conductive metal such as Rh on the exposed surfaces of the fore end part 3. At this time, the lower surface of the outer metallic layer 11 faces the silicon substrate 300 and is not exposed, and the seed film 301 is covered with the insulating film 311. For this reason, the conductive metallic film 312 is formed on the outer circumferential surface of the fore end part 3 except for the lower surface of the outer metallic layer 11.

Figure 7D:
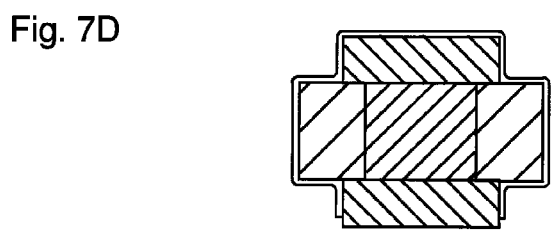

FIG. 7D illustrates a state where the fore end part 3 is separated from the silicon substrate 300.

The contact probe 101 according to the present embodiment has the stacked structure that sandwiches the intermediate metallic layer 12 between the outer metallic layers 11 and 13, and includes: the contact part 2 that is brought into abutting with a test object; the elastic deformation part 4 that is elastically deformed so as to be curved in the predetermined direction of curvature N by compression force in the longer direction; and the fore end part 3 that is formed between the contact part 2 and the elastic deformation part 4 and supported by the through-hole 121 of the guide plate 120 so as to make the contact part 2 movable in the longer direction, in which the side surfaces of the fore end part 3 formed in the direction of curvature N and the opposite direction N' of the elastic deformation part 4 are configured to include the three metallic layers 11 to 13, and on the side surfaces, the intermediate metallic layer 12 is configured to protrude relative to the outer metallic layers 11 and 13.

Employing such a configuration makes it possible to press the intermediate metallic layer 12 toward an inner surface 122 of the through-hole 121 at the time of overdrive. For this reason, as compared with the case where a level difference is formed between the metallic layers 11 to 13 such that any of the outer metallic layers 11 and 13 protrudes relative to the intermediate metallic layer 12, the contact probe 101 can be suppressed from being twisted. Also, shavings can be suppressed from being produced at the time of sliding to make the contact probe 101 difficult to move or cause adjacent contact probes 101 to be mutually short-circuited. Further, since a side surface of the fore end part 3 is supported by the through-hole 121 of the guide plate 120 so as to make the contact part 2 movable in the longer direction, the contact part 2 can be accurately positioned in the two-dimensional plane at the time of overdrive.

In addition, in the contact probe 101 according to the present embodiment, the plating layer is formed on the side surfaces of the fore end part 3 so as to extend across the intermediate layer and the outer layers. Such a configuration makes it possible to smoothly cover parts corresponding to level differences between the intermediate layer and the outer layers, and make the level differences gentle. For this reason, a side surface of the fore end part 3 can be suppressed from sliding while locally contacting with a corresponding inner surface 122 of the through-hole 121. As a result, shavings can be suppressed from being produced at the time of the sliding.

Note that in the present embodiment, the intermediate metallic layer 12 of the fore end part 3 is configured differently from the case of the elastic deformation part 4 in consideration of resistivity, mechanical strength, cost, and the like, but can also be configured in the same manner as the case of the elastic deformation part 4. That is, the intermediate metallic layer 12 of the fore end part 3 can be configured without being divided into the three areas. Further, for the intermediate metallic layer 12 of the fore end part 3, for example, gold (Au) can also be used.

Also, in the present embodiment, the example where the main body part 1 includes the three metallic layers 11 to 13 is described; however, the present invention is not limited to only such a configuration. That is, the main body part 1 can also be configured to include four or more metallic layers. For example, the intermediate metallic layer 12 can also be configured to include two or more layers.

Further, in the present embodiment, the example of the case where the elastic deformation part 4 is divided into the three beam parts 41 to 43 is described; however, the present invention is not limited to only such a configuration. That is, the elastic deformation part 4 may be configured to be divided into two or more beam parts. Further, the elastic deformation part 4 may be configured not to be divided.

In addition, in the present embodiment, the example of the case of the vertical type probe is described; however, the present invention is not limited to only such a case. For example, the present invention can also be applied to a cantilever type probe having cantilever structure.

Embodiment 2

In Embodiment 1, the contact probe 101 of which the fore end part 3 supported by the guide plate 120 has the cross-shaped cross section is described. On the other hand, in the present embodiment, a contact probe 102 of which a base end part 5 supported by a guide plate 130 has a cross-shaped cross section is described.

Figure 9:
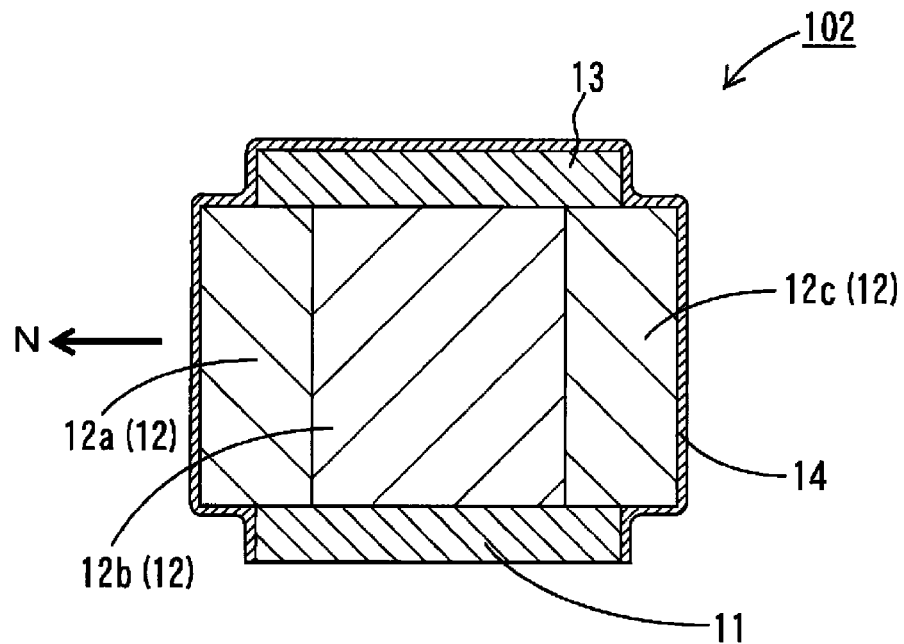
FIG. 9 is a cross-sectional view of the contact probe 102 in FIGS. 8A and 8B.

FIGS. 8A and 8B are appearance views illustrating a configuration example of the contact probe 102 according to Embodiment 2 of the present invention, in which FIGS. 8A and 8B respectively illustrate different side surfaces of the contact probe 102. FIG. 9 is a cross-sectional view illustrating the configuration example of the contact probe 102, and illustrates a cross section when cutting the base end part 5 along a C-C cutting plane line in FIGS. 8A and 8B.

When comparing the contact probe 102 according to the present embodiment with the contact probe 101 (Embodiment 1) in FIGS. 2A and 2B, a configuration of the base end part 5 is different; however, the other configurations are the same, and therefore redundant description is omitted. Also, the C-C cutting plane of the base end part 5 illustrated in FIGS. 8A and 8B is the same in shape and materials as the case of the A-A cutting plane of the fore end part 3 illustrated in FIG. 3A.

The base end part 5 is configured by sandwiching an intermediate metallic layer 12 between outer metallic layers 11 and 13, in which the intermediate metallic layer 12 is formed so as to protrude relative to the outer metallic layers 11 and 13, and has the cross-shaped cross section. The length of each of the protrusions of the intermediate metallic layer 12 is only required to be at a level that can prevent reversal caused by variations in a manufacturing process, and arbitrary.

Also, the intermediate metallic layer 12 is configured to include three metallic areas 12a to 12c arrayed in a direction of curvature N. The outer metallic layers 11 and 13 of the base end part 5 are made of the same material as that of the outer metallic layers 11 and 13 of an elastic deformation part 4, and formed simultaneously with these metallic layers. Further, the intermediate metallic layer 12 of the base end part 5, i.e., the metallic areas 12a to 12c are made of the same materials as those of the metallic areas 12a to 12c of a fore end part 3, and formed simultaneously with these metallic areas.

In addition, on the outer circumferential surface of the base end part 5, a thin film layer 14 is formed. The thin film layer 14 of the base end part 5 is made of the same material as that of the thin film layer 14 of the fore end part 3, and formed simultaneously with the thin film layer 14 of the fore end part 3 by an electroplating process. Forming such a thin film layer 14 around the base end part 5 makes it possible to suppress conductive shavings from being produced from a side surface of the base end part 5.

Figure 10:
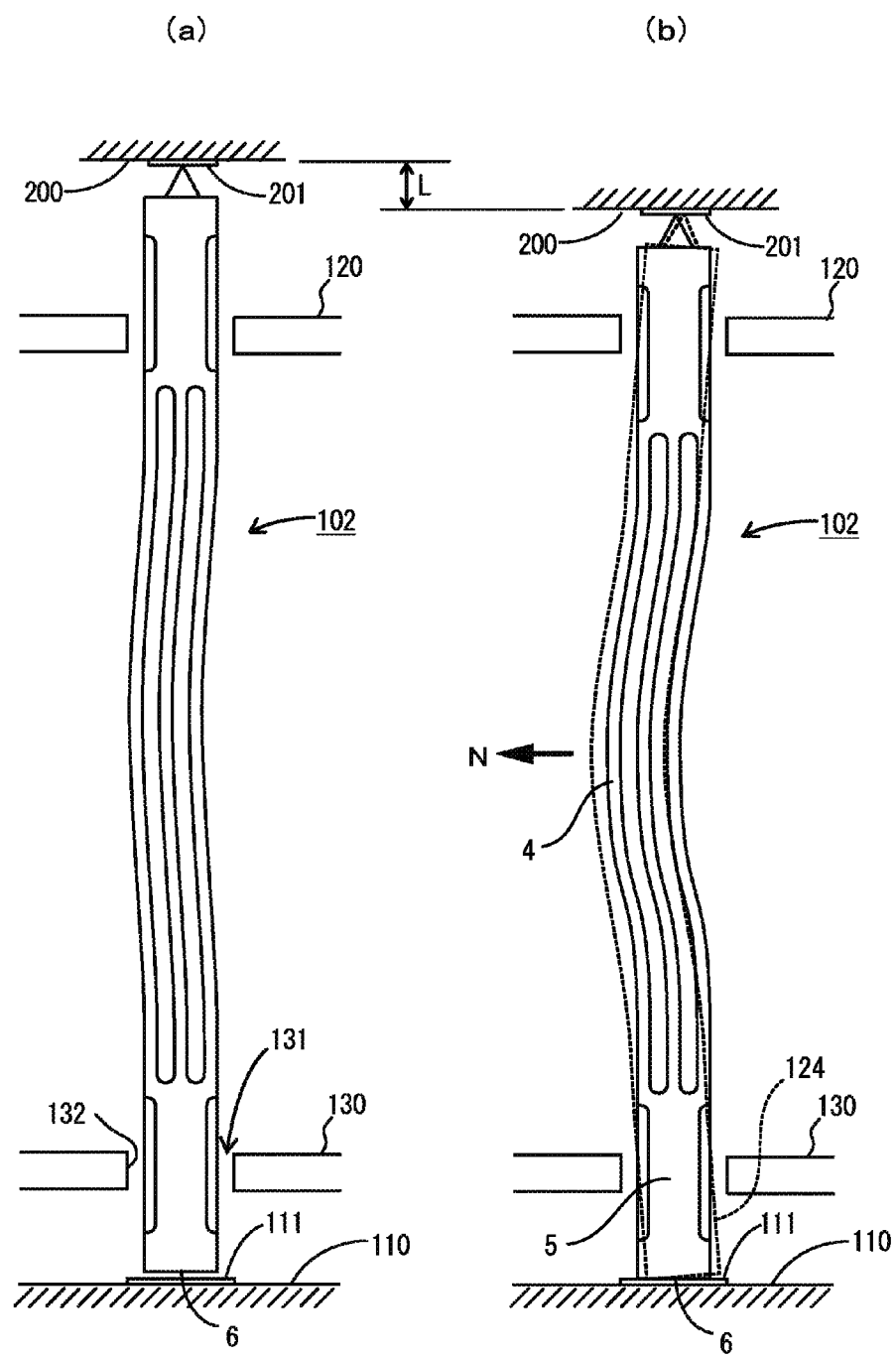
FIGS. 10A and 10B are explanatory views schematically illustrating a situation where the contact probe 102 in FIGS. 8A and 8B is used to perform an electrical characteristics test.

FIGS. 10A and 10B are explanatory views schematically illustrating a situation where the contact probe 102 in FIGS. 8A and 8B is used to perform an electrical characteristics test. Note that a wiring board 110 and guide plates 120 and 130 are well-known components included in a probe card, and a semiconductor wafer 200 is an example of a test object.

A terminal part 6 is arranged so as to face a probe electrode 111 formed on the wiring board 110. Also, the base end part 5 is supported by the guide plate 130 movably in the longer direction. For this reason, the base end part 5 is slightly moved in the longer direction by reaction force from an electrode terminal 201 at the time of overdrive, and thereby the terminal part 6 can be brought into abutting with the probe electrode 111. That is, without fastening the contact probe 102 to the wiring board 110, the terminal part 6 can be surely conducted to the probe electrode 111. Accordingly, the contact probe 102 can be easily replaced.

For the guide plate 130, for example, a silicon substrate is used, and a through-hole 131 corresponding to the contact probe 102 is formed. The contact probe 102 is arranged in a state of passing through the through-hole 131 such that the side surfaces of the base end part 5 face corresponding inner surfaces 132 of the through-hole 131. As a result, the base end part 5 is positioned in a two-dimensional plane parallel to the guide plate 130 while keeping the state of being movable in the longer direction.

FIG. 10A illustrates a situation just before overdrive. At this time, the contact probe 102 is not elastically deformed, and the terminal part 6 is slightly separated from the probe electrode 111 and therefore not conducted to the probe electrode 111.

FIG. 10B illustrates a situation after the overdrive. The contact probe 102 after the overdrive is elastically deformed in response to the reaction force from the electrode terminal 201, and the vicinity of the center of the elastic deformation part 4 is displaced in the direction of curvature N, thus increasing the curvature of a curved shape. At this time, a side surface of the base end part 5 slides on a corresponding inner surface 132 of the through-hole 131. In addition, along with the elastic deformation of the elastic deformation part 4, force attempting to displace the base end part 5 in the direction of curvature N or a direction N' opposite to the N, or tilt 124 the base end part 5 acts. As a result, the base end part 5 is a sliding part that slides in a state of being pressed against the inner surface 132 of the through-hole 131 in the direction of curvature N or the opposite direction N'.

For this purpose, by protruding the intermediate metallic layer 12 relative to the outer metallic layers 11 and 13, and forming a cross section of the base end part 5 in the cross shape, at the time of the overdrive, an end surface of the intermediate metallic layer 12 and the inner surface 132 of the through-hole 131 slide on each other while facing each other in the direction of curvature N or the opposite direction N'. Accordingly, at the time of the overdrive, without causing a tilt or twist of the contact probe 102, shavings can be suppressed from being produced.

In the present embodiment, the contact probe 102 is connected to the wiring board 110; the base end part 5 that is formed between a connecting part with the wiring board 110 and the elastic deformation part 4 and supported by the through-hole 121 of the guide plate 120 so as to make a contact part 2 movable in the longer direction is provided; the side surfaces of the base end part 5 formed in the direction of curvature N and the opposite direction N' of the elastic deformation part 4 are configured to include the three metallic layers 11 to 13; and on the side surfaces, the intermediate metallic layer 12 is configured to protrude relative to the outer metallic layers 11 and 13.

The contact probe 102 according to the present embodiment has stacked structure that sandwiches the intermediate metallic layer 12 between the outer metallic layers 11 and 13, and includes: the elastic deformation part 4 that is elastically deformed so as to be curved in the predetermined direction of curvature N by compression force in the longer direction; the terminal part 6 that is conducted to the probe electrode 111 on the wiring board 110; and the base end part 5 that is formed between the contact part 2 and the terminal part 6 and supported by the through-hole 131 of the guide plate 130 movably in the longer direction, in which the side surfaces of the base end part 5 formed in the direction of curvature N and the opposite direction N' of the elastic deformation part 4 are configured to includes the three metallic layers 11 to 13, and on the side surfaces, the intermediate metallic layer 12 is configured to protrude relative to the outer metallic layers 11 and 13.

Employing such a configuration makes it possible to press the intermediate metallic layer 12 against the inner surface 132 of the through-hole 131 at the time of overdrive. For this reason, as compared with the case where a level difference is formed between the metallic layers 11 to 13 such that any of the outer metallic layers 11 and 13 protrudes relative to the intermediate metallic layer 12, the contact probe 102 can be suppressed from being twisted. Also, shavings can be suppressed from being produced at the time of sliding to make the contact probe 102 difficult to move or cause adjacent contact probes 102 to be mutually short-circuited. Further, since a side surface of the base end part 5 is supported movably in the longer direction by the through-hole 131 of the guide plate 130, the contact probe 102 can be easily replaced while accurately positioning the terminal part 6 in the two-dimensional plane.

In addition, in the contact probe 102 according to the present embodiment, on the side surfaces of the base end part 5, the plating layer is formed so as to extend across the intermediate layer and the outer layers. Such a configuration makes it possible to smoothly cover parts corresponding to level differences between the intermediate layer and the outer layers, and make the level differences gentle. For this reason, a side surface of the base end part 5 can be suppressed from sliding while locally contacting with a corresponding inner surface 132 of the through-hole 131. As a result, shavings can be suppressed from being produced at the time of the sliding.

Note that in the present embodiment, the intermediate metallic layer 12 of the base end part 5 is configured differently from the case of the elastic deformation part 4 in consideration of resistivity, mechanical strength, cost, and the like, but can also be configured in the same manner as the case of the elastic deformation part 4. That is, the intermediate metallic layer 12 of the base end part 5 can be configured without being divided into the three areas. Further, for the intermediate metallic layer 12 of the base end part 5, for example, gold (Au) can also be used.

Also, in the present embodiment, the example of the case where the fore end part 3 and the base end part 5 both have the cross-shaped cross sections is described; however, the present invention is not limited to only such a configuration. For example, the base end part 5 may be configured to have a cross-shaped cross section, and the fore end part 3 may be configured not to have a cross-shaped cross section.

Embodiment 3

In Embodiments 1 and 2, the examples of the case where the elastic deformation part 4 is configured to include the three beam parts 41 to 43 are described. On the other hand, in the present embodiment, the case where an elastic deformation part 4 is configured to include one beam part is described.

FIGS. 11A and 11B are appearance views illustrating a configuration example of a contact probe 103 according to Embodiment 3 of the present invention, in which FIGS. 11A and 11B respectively illustrate different side surfaces of the contact probe 103. When comparing the contact probe 103 according to the present embodiment with the contact probe 102 (Embodiment 2) in FIGS. 8A and 8B, a configuration of the elastic deformation part 4 is different; however, other configurations are the same, and therefore redundant description is omitted.

The elastic deformation part 4 is configured to include one beam part formed as an elongate plate-like body, and on both sides thereof, a fore end part 3 and a base end part 5 are provided. That is, the elastic deformation part 4 is configured to include only the one beam part without being divided into two or more beam parts 41 to 43. Also, the elastic deformation part 4 is of a gently curved shape before overdrive, and at the time of overdrive, bucklingly deformed so as to increase the curvature of the curved shape. Accordingly, a direction of curvature N of the elastic deformation part 4 is predetermined.

Figure 12:
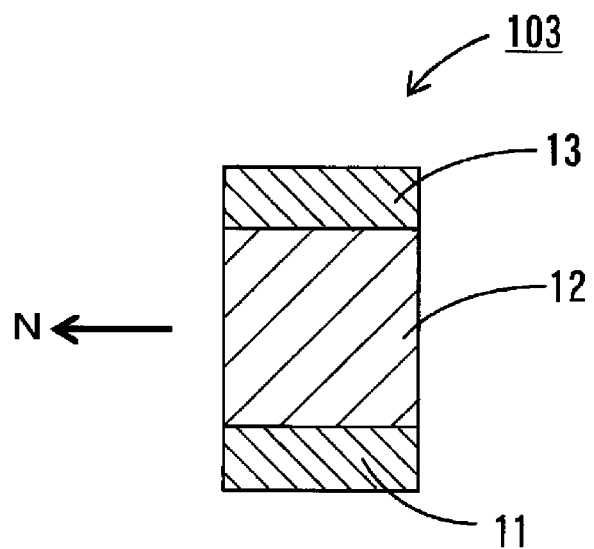
FIG. 12 is a cross-sectional view of the contact probe 103 in FIGS. 11A and 11B.

FIG. 12 is a cross-sectional view illustrating the configuration example of the contact probe 103 in FIGS. 11A and 11B, and illustrates a cross section when cutting the elastic deformation 4 along a D-D cutting plane line in FIGS. 11A and 11B. Note that the D-D cutting plane line is a cutting plane line orthogonal to the longer direction of the contact probe 103.

The elastic deformation part 4 has a rectangular-shaped cross section, and the thickness of the cross section is small as compared with the width. Also, the elastic deformation part 4 is configured by arraying three metallic layers 11 to 13 in the width direction thereof so as to sandwich the intermediate metallic layer 12 between the outer metallic layers 11 and 13. That is, the elastic deformation part 4 is of the same shape as that of and made of the same material as that of any one of the beam parts 41 to 43 (Embodiment 1) in FIGS. 3A and 3B.

In the contact probe 103 according to the present embodiment, as in Embodiment 2, on the side surfaces of the fore end part 3 and the base end part 5 in the direction of curvature N or a direction N' opposite to the N, the intermediate metallic layer 12 is configured to protrude relative to the outer metallic layers 11 and 13. Employing such a configuration makes it possible to suppress a twist of the contact probe 103 and the production of shavings even in the case where the elastic deformation part 4 is not divided into two or more beam parts. That is, the present invention can also be applied to a contact probe of which an elastic deformation part 4 is not divided.

Embodiment 4

In Embodiments 1 to 3, the contact probes 101 to 103 each of which the fore end part 3 or base end part 5 having the cross-shaped cross section is formed with the thin film layer 14 are described, respectively. On the other hand, in the present embodiment, a contact probe 104 of which an elastic deformation part 4 is formed with a thin film layer 15 is described.

Figure 13:
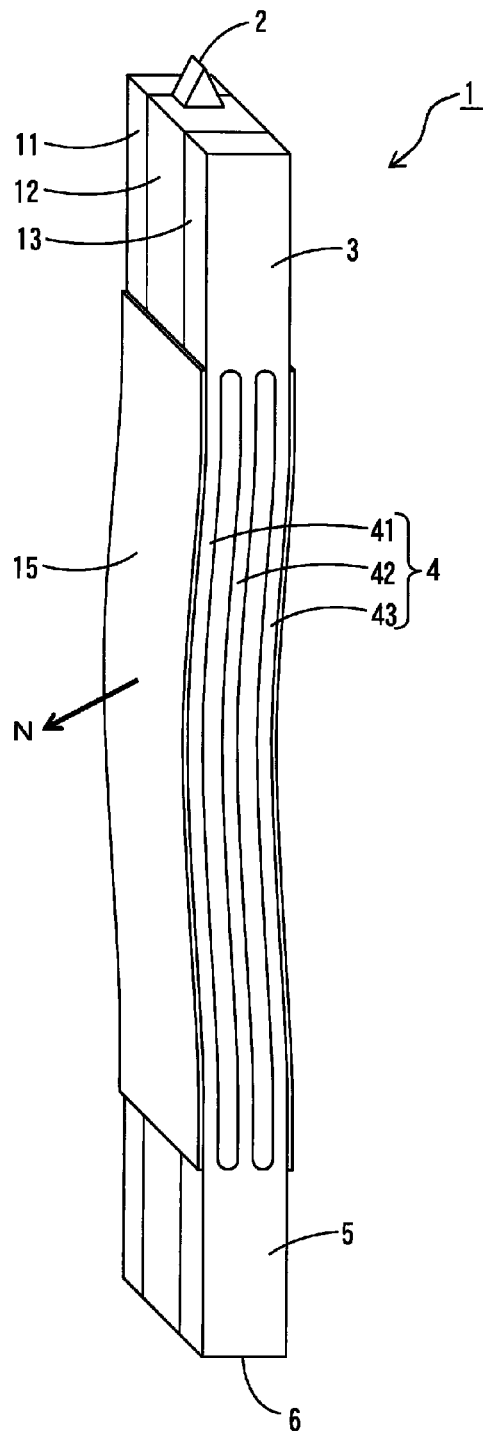
FIG. 13 is an appearance view illustrating a configuration example of a contact probe 104 according to Embodiment 4 of the present invention, in which a perspective view of the contact probe 104 is illustrated.

FIGS. 13 and 14A and 14B are appearance views illustrating a configuration example of the contact probe 104 according to Embodiment 3 of the present invention. FIG. 13 illustrates a perspective view of the contact probe 104, and FIGS. 14A and 14B respectively illustrate difference side surfaces of the contact probe 104. When comparing the contact probe 104 with the contact probe 101 (Embodiment 1) in FIGS. 2A and 2B, the contact probe 104 is different in that a cross section of a fore end part 3 is of a rectangular shape, and the elastic deformation part 4 is formed with the thin film layer 15. Other configurations are the same as those in the case of Embodiment 1, and therefore redundant description is omitted.

The thin film layer 15 is a conductive metallic layer using a metallic material having higher mechanical strength than that of an intermediate metallic layer 12, and as compared with the thicknesses of metallic layers 11 to 13, formed sufficiently thin. The thin film layer 15 is formed on the side surfaces in a direction of curvature N and a direction opposite thereto of the elastic deformation part 4. That is, the thin film layer 15 is formed on the outer principal surfaces of beam parts 41 and 43 arranged on both sides. Covering the intermediate metallic layer 12 exposed on the side surfaces of the elastic deformation part 4 with the thin film layer 15 prevents the side surfaces of the elastic deformation part 4 from being formed with unevenness and brought into a rough state in the case where overdrive is repeated.

Figure 15:
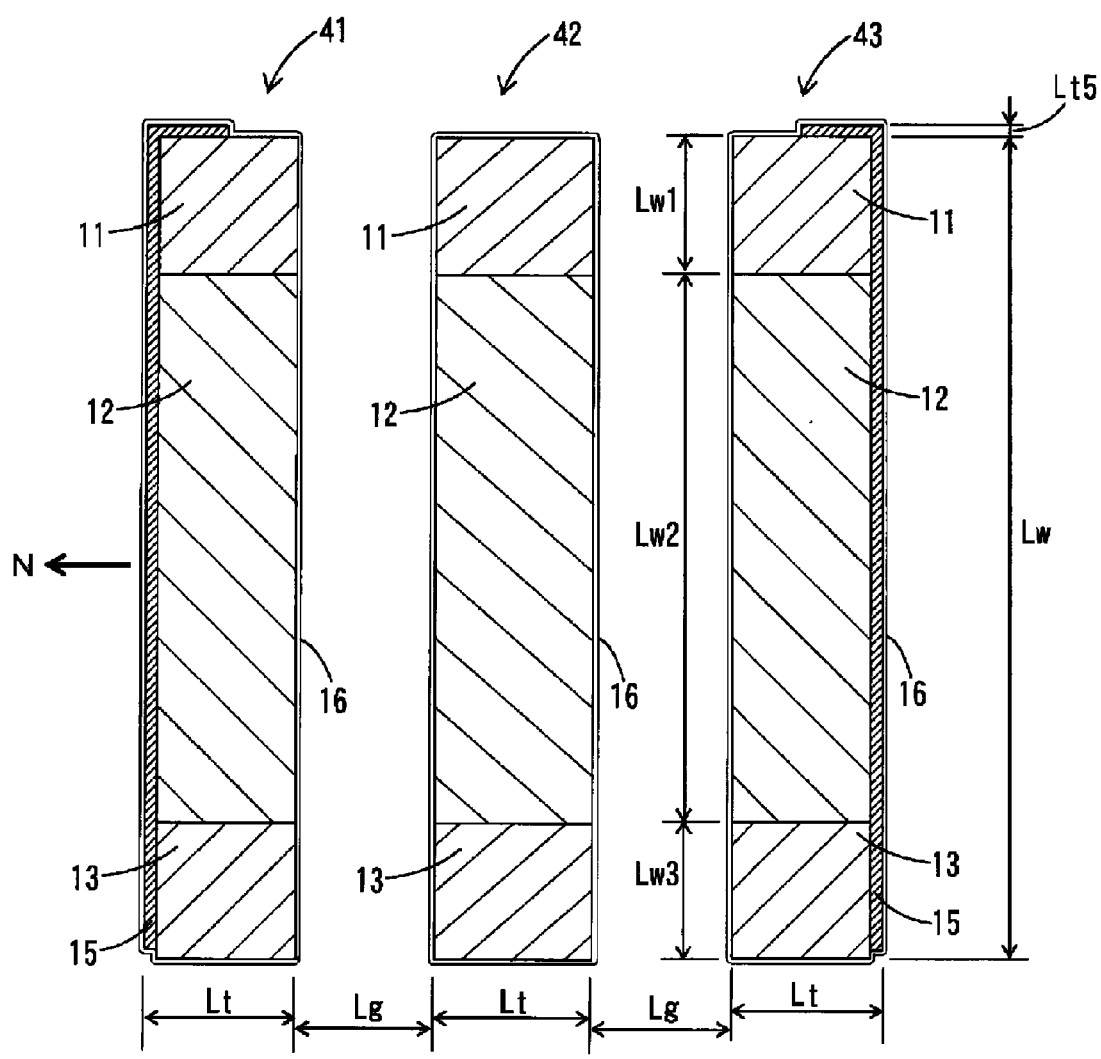
FIG. 15 is a cross-sectional view of the contact probe 104 in FIG. 13.

FIG. 15 is a cross-sectional view of the contact probe 104 in FIG. 13, and illustrates a cross section when cutting the elastic deformation part 4 along an E-E cutting plane line in FIGS. 14A and 14B. Note that the E-E cutting plane line is a cutting plane line orthogonal to the longer direction of the contact probe 104.

The thin film layer 15 is formed on the outer principal surfaces of the beam parts 41 and 43 arranged on both sides, and covers the intermediate metallic layer 12 exposed on the side surfaces of the elastic deformation part 4. For the thin film layer 15, for example, a nickel-cobalt alloy (Ni—Co) is used. Also, the thin film layer 15 is formed so as to make the thickness Lt5 thereof sufficiently thin as compared with the thicknesses Lt of the beam parts 41 to 43.

In this example, the thin film layer 15 is formed so as to cover substantially the whole of the principal surfaces, as well as covering parts of end surfaces of the beam parts 41 and 43 with one end thereof getting around to each of the end surfaces. On the other hand, on the rest of the principal surfaces of the beam parts 41 to 43, the thin film layer 15 is not formed.

That is, on the inner principal surfaces of the beam parts 41 and 43 on both sides, the thin film layer 15 is not formed. For this reason, as compared with the case where the thin film layer 15 is formed on both surfaces, the intermediate metallic layer 12 can be formed thicker to reduce the electrical resistances of the beam parts 41 and 43 as long as the thicknesses Lt of the beam parts 41 and 43 are the same.

In addition, regarding the inner beam part 42, the thin film layer 15 is not formed on any of both principal surfaces. For this reason, the intermediate metallic layer 12 can be formed thicker than the beam parts 41 and 43 to reduce electrical resistance. Note that the moments of inertia of area of the beam parts 41 to 43 are substantially determined by the thickness Lt of a stress layer corresponding to the metallic layer 11 or 13 added with the thin film layer 15, and the thin film layer 15 formed on the metallic layer 12 as a conductive layer hardly affects the moment of inertia of area.

Also, the beam parts 41 and 43 on both sides have the thin film layer 15, whereas the inner beam part 42 does not have the thin film layer 15; however, the beam parts 41 to 43 are all formed so as to have substantially the same thickness Lt. That is, in the beam parts 41 and 43 on both sides, as compared with the inner beam part 42, the metallic layers 11 to 13 are formed thinner by the thickness Lt5 to make the thickness Lt of the whole including the thin film layer 15 coincide with the thickness Lt of the beam part 42.

By employing such a configuration, the thickness of each of both sides in the width direction, which respectively function as the stress layer, i.e., the sum of the thickness of the metallic layer 11 or 13 and the thickness of the thin film layer 15 can be made coincident among all of the beam parts 41 to 43. Accordingly, at the time of overdrive, pressing force can be uniformly distributed to the respective beam parts 41 to 43, and the beam parts 41 to 43 can be respectively deformed so as to have substantially the same curved shape as each other.

Note that differently from a variation in thickness Lt caused by forming the thin film layer 15 on the principal surface of the beam part 41 or 43, a variation in width Lw caused by forming the thin film layer 14 on the end surface of the beam part 41 or 43 hardly affects the moment of inertia of area of the beam part 41 or 43, and therefore can be ignored.

An insulating film 16 is an insulating film formed on the entire outer circumferential surfaces of the beam parts 41 to 43, and made of, for example, aluminum nitride (AlN). By forming the insulating film on the outer edges of the beam parts 41 to 43, adjacently arranged contact probes 104 can be prevented from contacting with each other and being short circuited. Note that the insulating film 16 is sufficiently thinner than the thin film layer 15, of which mechanical strength is also low, and therefore hardly affects the moments of inertia of area of the beam parts 41 to 43.

The contact probe 104 is adapted to have, for example, the following sizes. The total length is 1.9 to 2.4 mm, and the length of the elastic deformation part 4 is 1.2 to 1.9 mm. Regarding the beam parts 41 to 43, the width Lw is 47 μm, the thickness Lt is 11 μm, and the thickness Lt5 of the thin film layer 15 is 1 μm, and the distance Lg of the gap between the beam parts 41 to 43 is 11 μm. Also, the widths Lw1 and Lw3 of the outer metallic layers 11 and 13 are both 11 μm, and the width Lw2 of the intermediate metallic layer 12 is 25 μm. The thickness of the insulating film 16 is 0.1 μm.

FIGS. 16A to 19C are explanatory views illustrating an example of a manufacturing process of the contact probe 104 in FIG. 13. The contact probe 104 is manufactured using so-called MEMS (Micro Electro Mechanical Systems) technology.

Figure 16A:
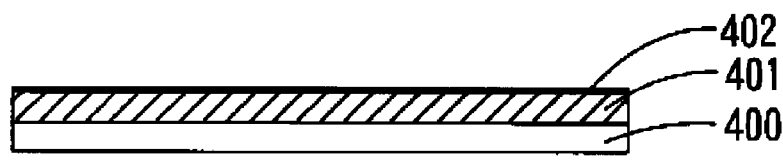
FIGS. 16A-16D are explanatory views illustrating an example of a manufacturing process of the contact probe 104 in FIG. 13.

FIG. 16A illustrates a substrate 400 on which an underlayer 401 and an insulating layer 402 are formed. The underlayer 401 is a thin film made of conductive metal such as Cu, and formed on the entire upper surface of the substrate 400 made of a silicon single crystal. The insulating film 402 is an insulating thin film made of silicon dioxide (SiO$_2$) or the like, and formed on the entire upper surface of the underlayer 401. The underlayer 401 and the insulating layer 402 can be formed by a vacuum evaporation method such as sputtering.

Figure 16B:
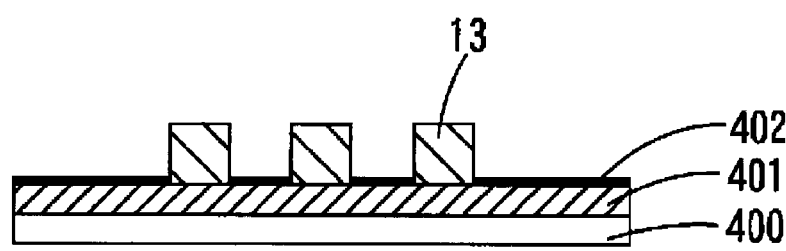

FIG. 16B illustrates a state where the outer metallic layer 13 is formed. The metallic layer 13 is formed using an electroplating method, and patterned using a photolithography technique. First, a resist film (not illustrated) made of a photoresist is formed on the insulating film 402, and the resist film only in areas corresponding to the metallic layer 13 is selectively removed. Then, the insulating film 402 in the areas where the resist film is not formed is removed to expose the underlayer 401. By depositing conductive metal such as a nickel-cobalt alloy (Ni—Co) in this state by an electroplating process, the metallic layer 13 can be formed in the areas where the resist film is not formed. After that, removing the resist film results in the state in FIG. 16B.

Figure 16C:
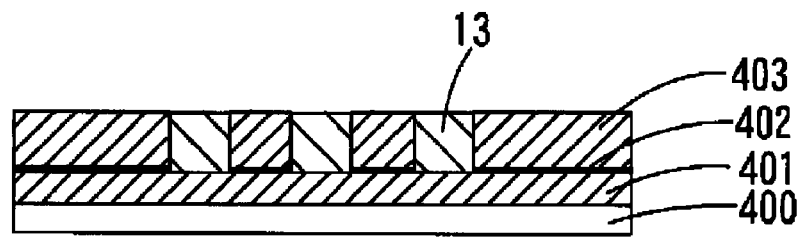

FIG. 16C illustrates a state where a sacrifice layer 403 is formed in areas where the metallic layer 13 is not formed, and the upper surface of the substrate 400 is planarized. The sacrifice layer 403 is made of conductive metal such as Cu, and formed using an electroplating method. Since electroplating cannot be performed on the insulating film 402, the sacrifice layer 403 is formed by first forming a thin film (not illustrated) made of conductive metal such as Cu on the insulating film 402 using a vacuum evaporation method such as sputtering, and performing electroplating on the thin film. Also, the upper surface of the substrate 400 is planarized by a polishing process after the formation of the sacrifice layer 403.

Figure 16D:
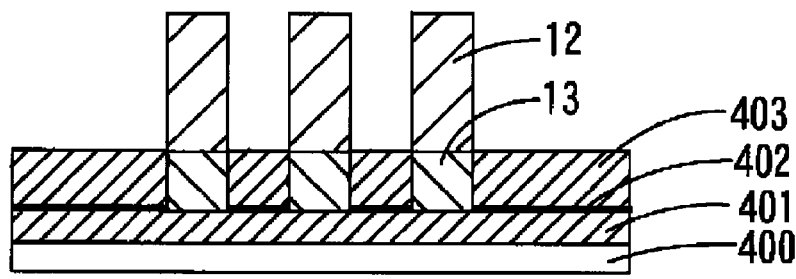

FIG. 16D illustrates a state where the intermediate metallic layer 12 is formed on the substrate 400. The metallic layer 12 is formed in the same areas as those of the metallic layer 13. Also, the metallic layer 12 is formed using an electroplating method in the same manner as that for the metallic layer 13, and patterned using a photolithography technique. Note that as a metallic material to be deposited, not a nickel-cobalt alloy (Ni—Co) but gold (Au) is used.

Figure 17A:
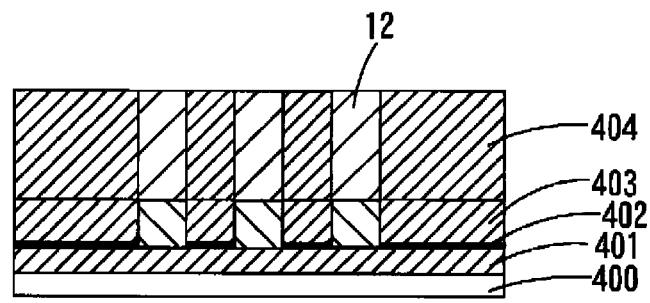
FIGS. 17A-17D are explanatory views illustrating the example of the manufacturing process of the contact probe 104, subsequent to FIGS. 16A-16D.

FIG. 17A illustrates a state where a sacrifice layer 404 is formed on the substrate 400 in FIG. 16D. The sacrifice layer 404 is formed by an electroplating method in areas where the metallic layer 12 is not formed. Also, the upper surface of the substrate 400 is planarized by a polishing process after the formation of the sacrifice layer 404.

Figure 17B:
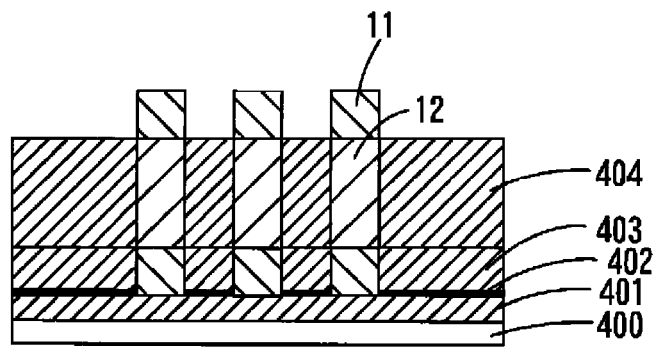

FIG. 17B illustrates a state where the outer metallic layer 11 is formed on the substrate 400. The metallic layer 11 is also formed in the same areas as those for the metallic layers 12 and 13. Also, in the same manner as those for the metallic layers 12 and 13, the metallic layer 11 is formed using an electroplating method, and patterned using a photolithography technique. As a metallic material to be deposited, a nickel-cobalt alloy (Ni—Co) is used.

Figure 17C:
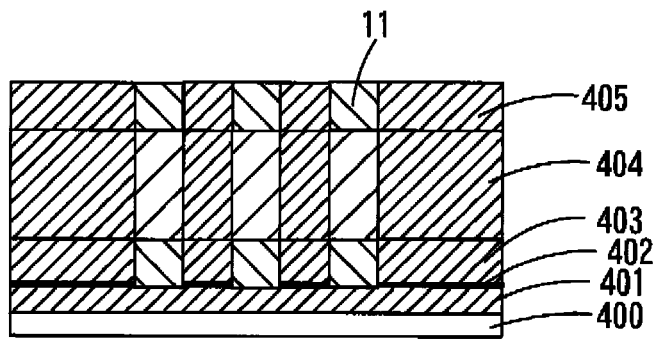

FIG. 17C illustrates a state where a sacrifice layer 405 is formed on the substrate 400. In the same manner as that for the sacrifice layer 404, the sacrifice layer 405 is formed in the areas where the metallic layer 11 is not formed. Also, the upper surface of the substrate 400 is planarized by a polishing process after the formation of the sacrifice layer 405.

Figure 17D:
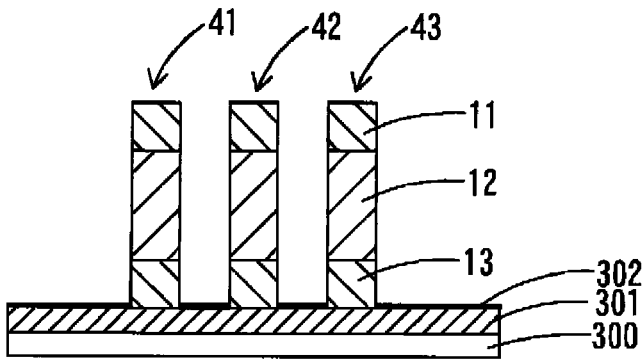

FIG. 17D illustrates a state where the sacrifice layers 403 to 405 are removed, and the insulating film 402 is exposed. The underlayer 401 is covered by the insulating film 402 and the metallic layer 13, and therefore without being removed together with the sacrifice layers 403 to 405, left on the substrate 400.

Figure 18A:
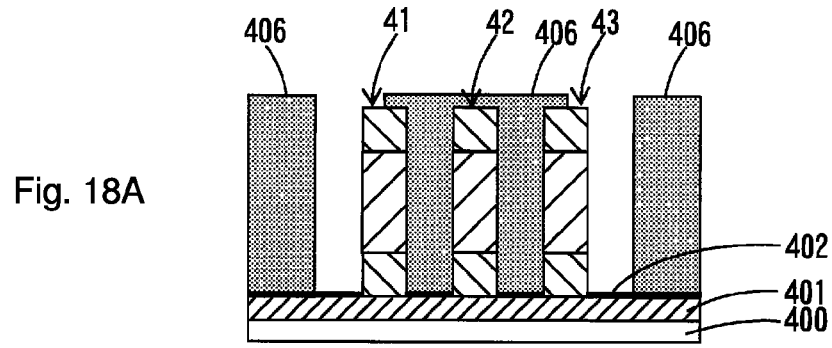
FIGS. 18A-18D are explanatory views illustrating the example of the manufacturing process of the contact probe 104, subsequent to FIGS. 17A-17D.

FIG. 18A illustrates a state where a resist film 406 is formed on the substrate 400 in FIG. 17D. The resist film 406 is formed by coating a photoresist to form the resist film on the entire surface of the substrate 400, and then selectively removing the resist film only in areas adjacent to the outer principal surfaces of the beam parts 41 and 43. That is, the resist film 406 is formed so as to cover the inner principal surfaces of the beam parts 41 to 43 adjacent to the gaps between the beam parts 41 to 43, and parts of the upper end surfaces continuous with the principal surfaces. In addition, the resist film 406 is also formed in areas on the substrate 400 sufficiently separated from the beam parts 41 to 43. In this manner, the entire area of the upper surface of the substrate 400 except for areas on the beam parts 41 and 43 where the thin film layer 15 is formed is masked by the insulating film 402 and the resist film 406.

Figure 18B:
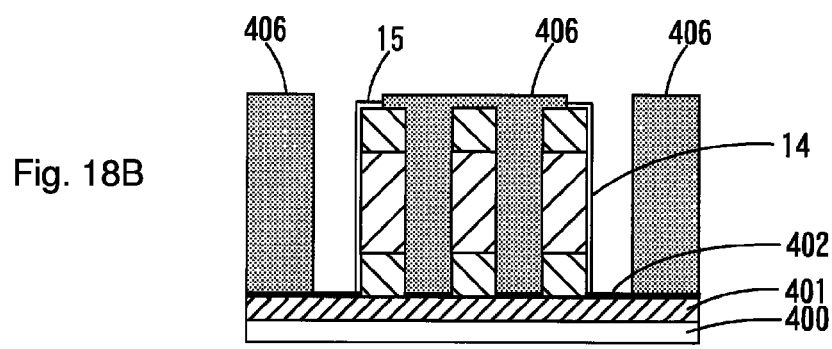

FIG. 18B illustrates a state where the thin film layer 15 is formed. The thin film layer 15 is formed by using an electroplating method to deposit conductive metal such as a nickel-cobalt alloy (Ni—Co) on exposed surfaces of the beam parts 41 and 43 in the state of FIG. 17A. At this time, since the principal surfaces of the beam parts 41 to 43 adjacent to the gaps are masked, the thin film 15 is not formed on these principal surfaces.

In the case of forming the thin film layer 15 on the principal surfaces adjacent to the narrow gaps, it is not easy to control the thickness of the thin film layer 15 with high accuracy, and therefore by masking these principal surfaces to prevent the formation of the thin film layer 15, a step of forming the thin film layer 15 can be made easy. As a result, variations in characteristics of the contact probe 104 can be suppressed.

Figure 18C:
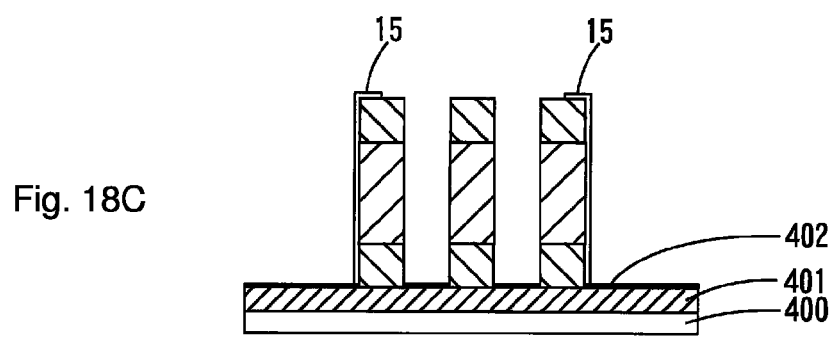
Figure 18D:
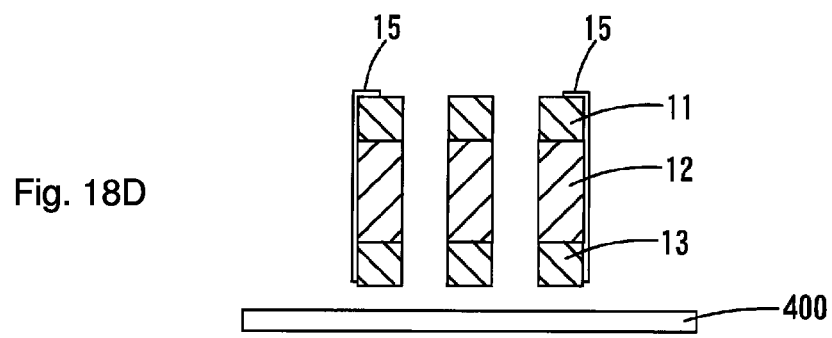

FIG. 18C illustrates a state where the resist film 406 is removed after the formation of the thin film layer 15. Also, FIG. 18D illustrates a state where the underlayer 401 and the insulating film 402 are further selectively removed. Regarding the underlayer 401 and the insulating film 402, areas including both ends of the contact probe 104 in the longer direction are left, and areas including the beam parts 41 to 43 are removed. As a result, in FIG. 18D, the beam parts 41 to 43 are in a state of being separated from the substrate 400.

Figure 19A:
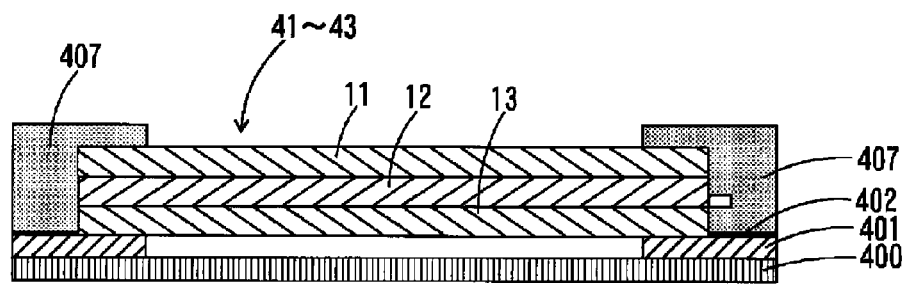
FIGS. 19A-19C are explanatory views illustrating the example of the manufacturing process of the contact probe 104, subsequent to FIGS. 18A-18D.

FIG. 19A is an explanatory view for explaining the state of the contact probe 104 in the step in FIG. 18D, and illustrates a cross section parallel to the longer direction of the contact probe 104. The underlayer 401 and the insulating film 402 are patterned using a photolithography technique. First, a resist film 407 made of a photoresist is formed on the substrate 400 in FIG. 18C, and the resist film in an area including the elastic deformation part 4 is selectively removed to leave the resist film in areas including the fore end part 3 and the base end part 5. Then, the underlayer 401 and the insulating film 402 in the area where the resist film is removed are removed. At this time, the resist film adjacent to the lower end surfaces of the beam parts 41 to 43 is also removed. As a result, both ends of the contact probe 104 are kept in a state of being supported by the substrate 400 through the underlayer 401, and the beam parts 41 to 43 are in the air and in a state where the entire surfaces thereof are exposed.

Figure 19B:
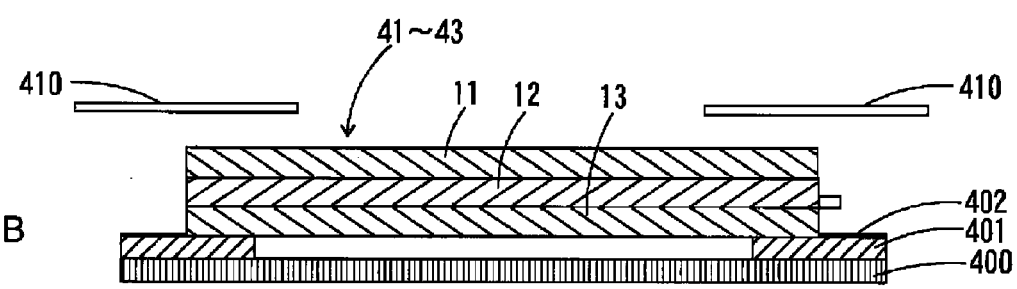
Figure 19C:
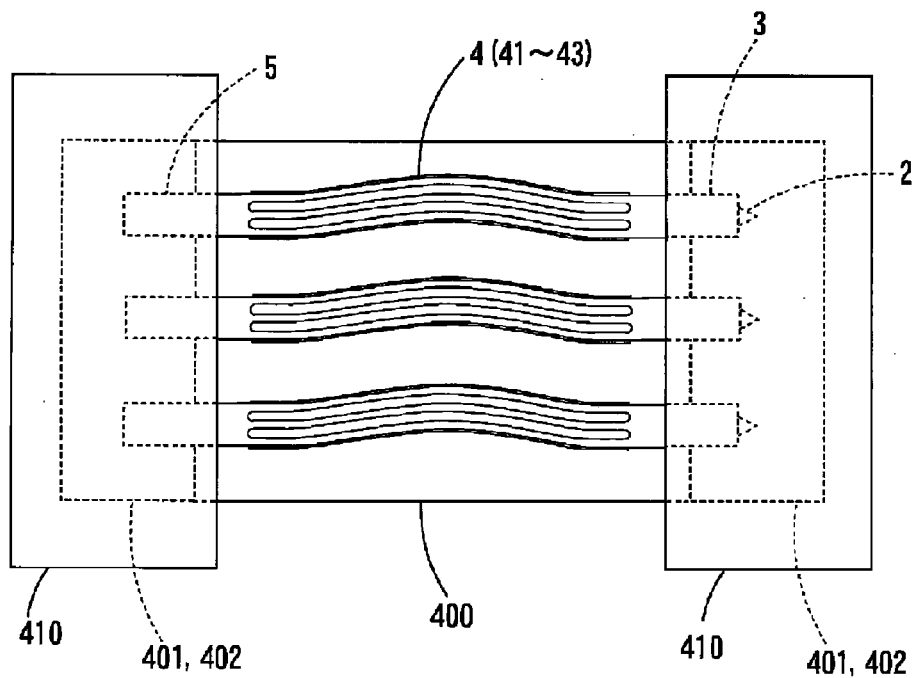

FIGS. 19B and 19C are diagrams illustrating a state of the contact probe 104 in a step of forming the insulating film 16, and FIG. 19B illustrates a cross section parallel to the longer direction of the contact probe 104, whereas FIG. 19C illustrates a plan view when viewing the substrate 400 from above.

The insulating film 16 is a thin film made of aluminum nitride (AlN) formed by sputtering, and formed on the entire surfaces of the beam parts 41 to 43. Also, the insulating film 16 is formed in the elastic deformation part 4, and selectively formed so as not to be formed in the fore end part 3 or the base end part 5. Here, the insulating film 16 is selectively formed by from the state in FIG. 18A, removing the resist film 407, then using a mask plate 410 to expose the elastic deformation part 4, and bringing the fore end part 3 and the base end part 5 into a masked state. Also, since the beam parts 41 to 43 are in the air, the insulating film 16 can also be formed on the lower end surfaces of the beam parts 41 to 43, and consequently formed on the entire circumferences of cross sections.

The contact probe 104 according to the present embodiment includes: the two or more beam parts 41 to 43 that are arranged so as to make adjacent principal surfaces face each other through a gap and respectively formed as elongate plate-like bodies; the fore end part 3 that connects the one ends of the beam parts 41 to 43 to one another; and the base end part 5 that connects the other ends of the beam parts 41 to 43 to one another. The beam part 41 to 43 is configured to include: the intermediate metallic layer 12 made of a first metal; the outer metallic layers 11 and 13 that are formed so as to sandwich the intermediate metallic layer 12 in the width direction and made of a second metal; and the thin film layer 15 that is formed so as to cover the intermediate metallic layer 12 on the outer principal surface of the beam part 41 to 43 and made of a third metal, in which the first metal has smaller resistivity than that of the second metal, and the second metal and the third metal have high mechanical strength as compared with the first metal.

Forming the beam parts 41 to 43 respectively as the plate-like bodies makes it possible to reduce stress produced at the time of curving in the direction of curvature N. For this reason, a larger curve can be formed within an elastic limit to shorten the probe length while ensuring a desired overdrive amount. That is, without reducing contact characteristics of the contact probe 104, high frequency characteristics can be improved.

Also, since the three beam parts 41 to 43 are provided, of which adjacent principal surfaces are made to face each other through a gap, the cross-sectional area of the contact probe 104 can be increased to ensure probe pressure and current resistant characteristics without increasing the thicknesses of the respective beam parts 41 to 43.

Further, the beam parts 41 to 43 have the metallic layer 12 as a conductive layer and the metallic layers 11 and 13 as stress layers, and therefore electrical resistance can be reduced while suppressing a reduction in mechanical strength. For this reason, the current resistant characteristics of the electrical contact can be improved while ensuring the probe pressure at the time of overdrive. In addition, by arranging the conductive layer so as to sandwich the conductive layer between the stress layers, the plate-like bodies at the time of overdrive can be prevented from being twisted or curved in a direction other than the thickness direction of the plate-like bodies.

Still further, by covering the metallic layer 12, which is plastically deformed at the time of overdrive, with the thin film layer 15, which is elastically deformed at the time of overdrive, on the outer principal surfaces of the beam parts 41 and 43 on both sides, the outer principal surfaces of the beam parts 41 and 43 on both sides can be prevented from being roughened when repeating the overdrive, and consequently the durability of the contact probe 104 can be improved. In particular, the occurrence of a short circuit between contact probes 104 caused by the breakage or peeling off of the insulating film 16 formed on the outer principal surfaces of the beam parts 41 and 43 can be effectively suppressed.

Also, in the contact probe 104 according to the present embodiment, the thin film layer 15 is formed on the outer principal surfaces of the beam parts 41 and 43 arranged on both sides, but not formed on the principal surfaces adjacent to the gaps.

By forming the thin film layer 15 only on the outer principal surfaces of the beam parts 41 and 43 arranged on both sides, as compared with the case of forming a thin film layer on both principal surfaces of the beam parts 41 and 43, the intermediate metallic layer 12 can be formed thicker to reduce the electrical resistance of the contact probe 104 as long as the thicknesses Lt of the beam parts are the same. Also, as compared with the case of forming the thin film layer 15 on the outer principal surfaces, in the case of forming the thin film layer 15 on the inner principal surfaces adjacent to the narrow gaps, thickness control becomes difficult. For this reason, by forming the thin film layer 15 only on the outer principal surfaces, manufacturing can be easily performed, and variations in characteristics of the contact probe 104 can be suppressed.

Further, the contact probe 104 according to the present embodiment is configured such that the beam parts 41 to 43 have substantially the same thickness Lt as each other. Employing such a configuration makes it possible to uniformly distribute pressing force at the time of overdrive to the respective beam parts 41 to 43, and deform the beam parts 41 to 43 so as to form substantially the same curved shape as each other. As a result, a larger overdrive amount can be ensured, and also the contact probe 104 can be suppressed from being tilted at the time of overdrive.

Embodiment 5

In Embodiment 4 above, the example of the contact probe 104 of which the elastic deformation part 4 is divided into the three beam parts 41 to 43 is described. On the other hand, in the present embodiment, a contact probe 105 of which an elastic deformation part 4 is divided into two beam parts 41 and 43 is described.

Figure 21:
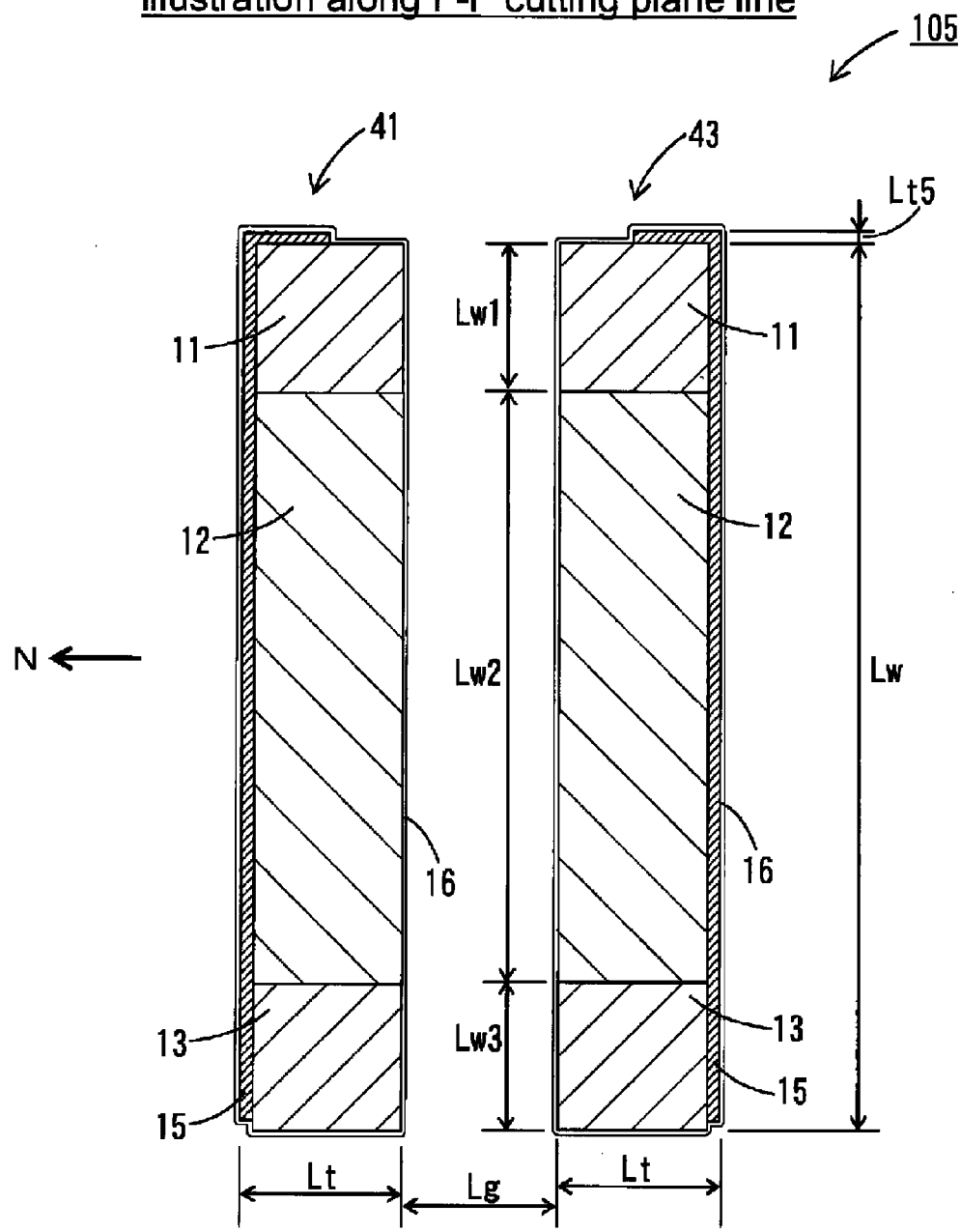
FIG. 21 is a cross-sectional view of the contact probe 105 in FIGS. 20A and 20B.

FIGS. 20A and 20B are appearance diagrams illustrating a configuration example of the contact probe 105 according to Embodiment 5 of the present invention, in which FIGS. 20A and 20B respectively illustrate different side surfaces of the contact probe 105. Also, FIG. 21 is a cross-sectional view of the contact probe 105 in FIGS. 20A and 20B, and illustrates a cross section when cutting the elastic deformation part 4 along an F-F cutting plane line. Note that the F-F cutting plane line is a cutting plane line orthogonal to the longer direction of the contact probe 105.

In the contact probe 105, the elastic deformation part 4 is configured to include the two beam parts 41 and 43 that are arranged through a gap, and different from the contact probe 104 in FIG. 13 in that the inner beam part 42 is not included; however, the other configurations are completely the same as those of the contact probe 104, and therefore redundant description is omitted.

The beam parts 41 and 43 are both formed with a thin film layer 15 on the outer principal surfaces. For this reason, the outer principal surfaces of the beam parts 41 and 43 can be prevented from being roughened by repetitive overdrive, and therefore the durability of the contact probe 105 can be improved. In particular, the occurrence of a short circuit between contact probes 105 caused by the breakage or peeling off of an insulating film 16 formed on the outer principal surfaces of the beam parts 41 and 43 can be effectively suppressed. In addition, on the inner principal surfaces facing each other, the thin film layer 15 is not formed. For this reason, as compared with the case where the thin film layer 15 is formed on both principal surfaces of the beam parts 41 and 43, an intermediate metallic layer 12 can be formed thicker to reduce electrical resistance as long as the thicknesses of the beam parts 41 and 43 are the same. Also, the formation of the thin film layer 15 can be made easy to suppress variations in characteristics of the contact probe 105.

Embodiment 6

In Embodiments 4 and 5, the examples of a contact probe of which an elastic deformation part 4 is divided into two or more beam parts 41 to 43 are described. On the other hand, in the present embodiment, the case where an elastic deformation part 4 is configured to include one beam part without being divided is described.

Figure 23:
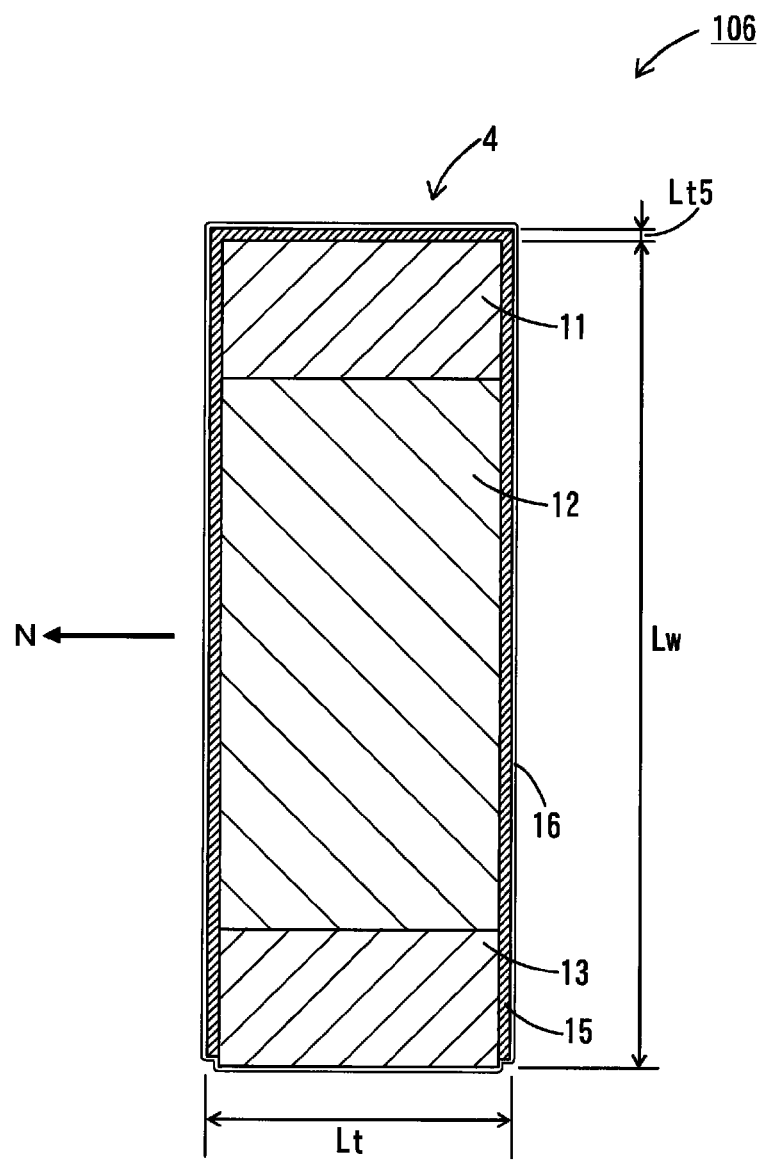
FIG. 23 is a cross-sectional view of the contact probe 106 in FIGS. 22A and 22B.

FIGS. 22A and 22B are appearance views illustrating a configuration example of a contact probe 106 according to Embodiment 6 of the present invention, in which FIGS. 22A and 22B respectively illustrate different side surfaces of the contact probe 106. Also, FIG. 23 is a cross-sectional view of the contact probe 106 in FIGS. 22A and 22B, and illustrates a cross section when cutting the elastic deformation part 4 along a G-G cutting plane line. Note that the G-G cutting plane line is a cutting plane line orthogonal to the longer direction of the contact probe 105.

The contact probe 106 is different from the contact probe 103 in FIG. 13 in that the elastic deformation part 4 is, without being divided, configured to include the one beam part formed as an elongate plate-like body; however, the other configurations are completely the same as those of the contact probe 103, and therefore redundant description is omitted.

On the principal surfaces on both sides of the elastic deformation part 4, as in Embodiments 4 and 5, a thin film layer 15 is formed. Employing such a configuration makes it possible to prevent the principal surface on both sides of the beam part 44 from being roughened by repetitive overdrive even in the case where the elastic deformation part 4 is not divided into two or more beam parts.

On the both principal surfaces of the elastic deformation part 4, as in Embodiments 4 and 5, the thin film layer 15 is formed. Employing such a configuration makes it possible to prevent the both principal surfaces of the elastic deformation part 4 from being roughed when repeating overdrive, and improve the durability of the contact probe 106 even in the case where the elastic deformation part 4 is not divided into two or more beam parts. In particular, the occurrence of a short circuit between contact probes 106 caused by the breakage or peeling off of an insulating film 16 formed on the both principal surfaces of the elastic deformation part 4 can be effectively suppressed.

Embodiment 7

In Embodiments 1 to 3, the examples of the contact probes 101 to 103 each of which the intermediate metallic layer 12 is formed so as to protrude relative to the outer metallic layers 11 and 13 in the fore end part 3 or in the base end part 5 are described, respectively. Also, in Embodiments 4 to 6, the contact probes 104 to 106 each of which the elastic deformation part 4 is formed with the thin film layer are described, respectively. In the present embodiment, a contact probe 107 combining these configurations is described.

Figures 24A, 24B:
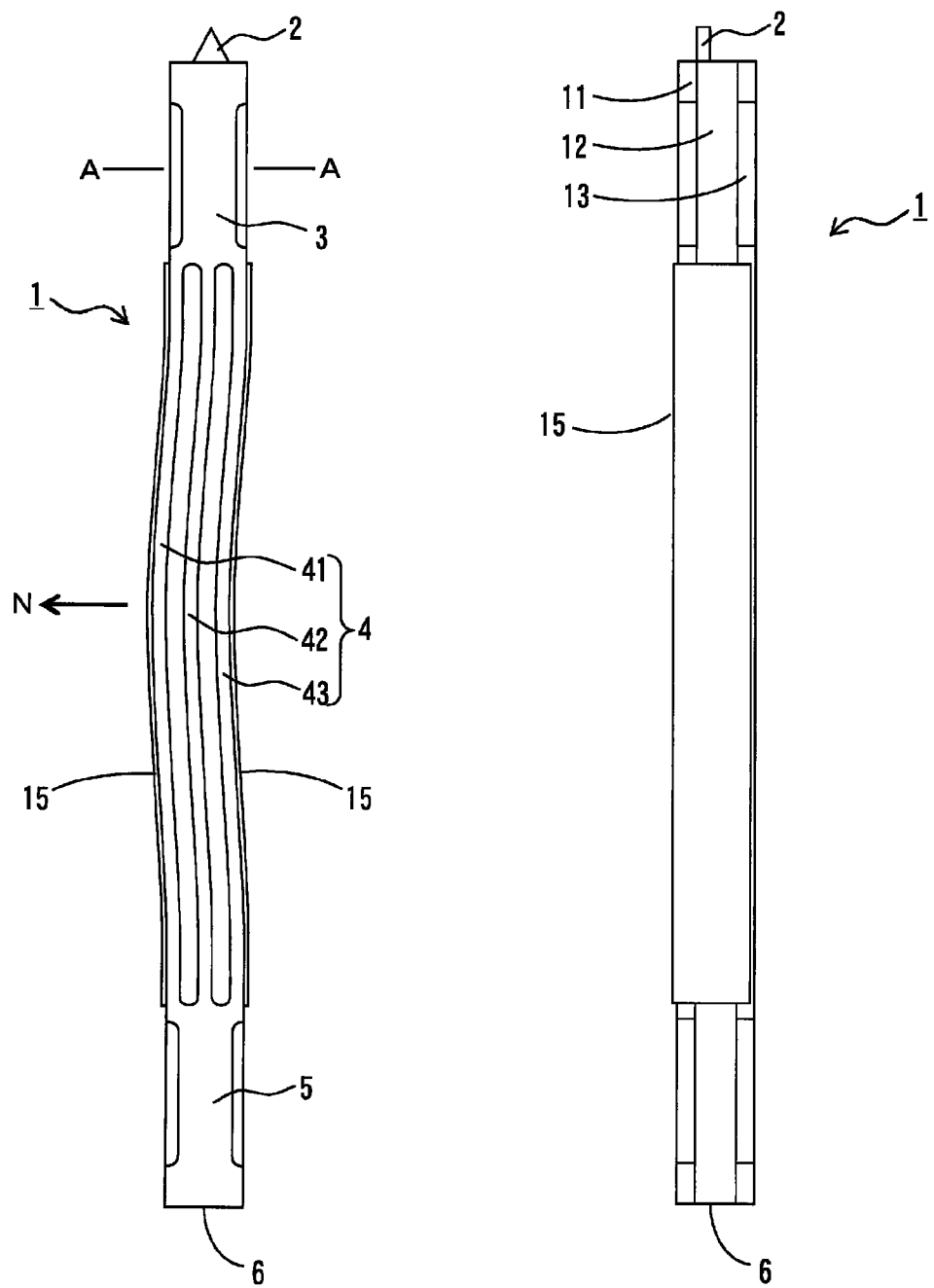
FIGS. 24A and 24B are appearance views illustrating a configuration example of a contact probe 107 according to Embodiment 7 of the present invention.

FIGS. 24A and 24B are perspective views illustrating a configuration example of the contact probe 107 according to Embodiment 7 of the present invention. Description of the same configuration as that of the contact probe 101 in FIG. 1 is omitted. A fore end part 3 of the contact probe 107 has, as with the contact probe 101 in FIG. 1, a cross-shaped cross section where an intermediate metallic layer 12 is formed so as to protrude relative to outer metallic layers 11 and 13. Also, as in the contact probe 104 in FIG. 13, among beam parts 41 to 43 of the contact probe 107, on the outer principal surfaces of the beam parts 41 and 43 arranged on both sides, a thin film layer 15 is formed. On the other hand, any of the inner principal surfaces of the beam parts 41 and 43, and the inner beam part 42 is not formed with the thin film layer 15.

By employing such a configuration, shavings can be suppressed from being produced at the time of sliding to make the contact probe 107 difficult to move or cause adjacent contact probes 107 to be mutually short-circuited. Also, the outer principal surfaces of the beam parts 41 and 43 can be prevented from being roughened by repetitive overdrive.

Note that in the present embodiment, the example of the contact probe 107 in which in a fore end part 3, the intermediate metallic layer 12 protrudes relative to the outer metallic layers 11 and 13, and on the outer principal surfaces of the beam parts 41 and 43, the thin film layer 15 is formed is described; however, the present invention is not limited to only such a configuration. For example, the present invention may be configured such that in both of the fore end part 3 and a base end part 5, the intermediate metallic layer 12 protrudes relative to the outer metallic layers 11 and 13, and on the outer principal surfaces of the beam parts 41 and 43, the thin film layer 15 is formed. In addition, the configurations of Embodiments 1 to 6 can be appropriately combined.

Also, in Embodiments 1 to 7 above, the examples of the case where the main body part 1 includes the three metallic layers 11 to 13 are respectively described; however, the present invention is not limited to only such a configuration. That is, the main body part 1 can also be configured to include four or more metallic layers. For example, as the intermediate metallic layer 12, two or more metallic layers made of mutually different metallic materials are provided, and these metallic layers are configured to be sandwiched by the outer metallic layers 11 and 13.

Further, in Embodiments 1 to 7 above, the examples of the case where the elastic deformation part 4 includes one to three beam parts are respectively described; however, the present invention is not limited to only such a configuration. That is, the elastic deformation part 4 may be configured to be divided into four or more beam parts.

Still further, in Embodiments 1 to 7 above, the examples of the case where for the intermediate metallic layer 12, gold (Au) is used, and for the outer metallic layers 11 and 13 and the thin film layer 15, a nickel-cobalt alloy (Ni—Co) is used are respectively described; however, the present invention is not limited to only such a configuration. That is, the specific metallic materials are exemplified, and other metallic materials can also be used. For example, in place of the nickel-cobalt alloy (Ni—Co), a palladium-cobalt alloy (Pd—Co) can also be used. In addition, desirably, for the outer metallic layers 11 and 13 and the thin film layer 15, the same metallic material is used; however, different metallic materials can also be used.

Yet further, in Embodiments 1 to 7 above, the examples of the case where the insulating film 16 is formed on the entire outer circumferential surface of the elastic deformation part 4 are respectively described; however, the present invention is not limited to only such a case. As long as the insulating film 16 is formed at least on the outer principal surfaces of the outer beam parts 41 and 43, i.e., at least on the thin film layer 15, an effect of preventing a short circuit between adjacent contact probes can be obtained. That is, a short circuit can be prevented from easily occurring by repetitive overdrive, and the durability of the contact probe can be improved. In addition, the present invention can also be applied to a contact probe of which beam parts 41 to 43 are not formed with an insulating film 16. In such a case, by covering an intermediate metallic layer 12 with a thin film layer 15, the intermediate metallic layer 12 on the outer principal surfaces can be prevented from being deformed, and durability can be improved.

Also, in Embodiments 1 to 7 above, the examples of the case of the vertical type probe are respectively described; however, the present invention is not limited to only such a case. The present invention can also be applied to, for example, a cantilever type probe having cantilever structure. Further, the present invention is not limited only to a contact probe used for an electrical characteristics test of semiconductor devices, but can be applied to various electrical contacts.

1 main body part
2 contact part
3 fore end part
4 elastic deformation part
5 base end part
6 terminal part
11~13 metallic layer
12a~12c metallic area
14 thin film layer
15 thin film layer
16 insulating film
41~43 beam part
101~107 contact probe
110 wiring board
111 probe electrode
120, 130 guide plate
121, 131 through-hole
122, 132 inner surface of the through-hole
200 semiconductor wafer
201 electrode terminal
L overdrive amount
Lg distance between the beams
Lw width between the beams
Lw1~Lw3 width of the metallic layers 11 and 13
N curve direction

The invention claimed is:

1. A contact probe comprising:
   a contact part that is brought into abutting with a test object;
   a terminal part that is electrically connected to a wiring board;
   an elastic deformation part that is provided between said contact part and said terminal part, and has a curved shape to predetermine a direction of curvature, wherein the direction of curvature is a direction of bowing of the elastic deformation part that is perpendicular to the longitudinal direction of the elastic deformation part,
   a sliding part that is supported by a through-hole of a guide plate movably in the longitudinal direction, and is tilted towards a predetermined direction by curvature of the elastic deformation part, wherein
   said sliding part has a side surface facing to an inner flat surface of the though-hole in said predetermined direction,
   said side surface comprises two outer parts on the outside in the width direction and an intermediate part sandwiched between said two outer parts,
   said intermediate part protrudes relative to said two outer parts towards said predetermined direction.

2. The contact probe according to claim 1, wherein on said side surface of said sliding part, a plating layer is formed so as to cover said intermediate part and said outer parts.

3. The contact probe according to claim 1, wherein said sliding part is formed between said contact part and said elastic deformation part.

4. The contact probe according to claim 1, wherein said sliding part is formed between said terminal part and said elastic deformation part.

* * * * *